United States Patent
Abrams et al.

(10) Patent No.: US 12,109,173 B1
(45) Date of Patent: Oct. 8, 2024

(54) PHARMACEUTICAL CONTAINER WITH PH PROTECTIVE LAYER DEPOSITED BY ATOMIC LAYER DEPOSITION

(71) Applicant: Innovative Scientific Products, Inc., Auburn, AL (US)

(72) Inventors: Robert Abrams, New York City, NY (US); Alexander Klibanov, Del Mar, CA (US); Robert Langer, Newton, MA (US); Glenn Fredrickson, Santa Barbara, CA (US)

(73) Assignee: INNOVATIVE SCIENTIFIC PRODUCTS, INC., Auburn, AL (US)

( * ) Notice: Subject to any disclaimer, the term of this patent is extended or adjusted under 35 U.S.C. 154(b) by 0 days.

(21) Appl. No.: 18/666,677

(22) Filed: May 16, 2024

Related U.S. Application Data

(60) Provisional application No. 63/550,319, filed on Feb. 6, 2024.

(51) Int. Cl.
*A61J 1/14* (2023.01)
*C23C 16/40* (2006.01)
*C23C 16/455* (2006.01)
*A61J 1/06* (2006.01)

(52) U.S. Cl.
CPC .......... *A61J 1/1468* (2015.05); *C23C 16/403* (2013.01); *C23C 16/405* (2013.01); *C23C 16/45553* (2013.01); *A61J 1/062* (2013.01); *A61J 1/065* (2013.01)

(58) Field of Classification Search
CPC .......... A61J 1/1468; A61J 1/062; A61J 1/065; C23C 16/403; C23C 16/405; C23C 16/4553
USPC ............ 206/438, 524.1, 524.2, 524.3, 524.4, 206/524.6
See application file for complete search history.

(56) References Cited

U.S. PATENT DOCUMENTS

| | | | |
|---|---|---|---|
| 2014/0034544 A1* | 2/2014 | Chang .................... | B65D 25/14 428/34.4 |
| 2020/0237997 A1* | 7/2020 | Brockmeyer ..... | A61M 5/31501 |
| 2024/0075211 A1* | 3/2024 | Weikart .................. | B32B 27/08 |

* cited by examiner

*Primary Examiner* — Jacob K Ackun
(74) *Attorney, Agent, or Firm* — Leydig, Voit & Mayer, Ltd.

(57) ABSTRACT

Disclosed is a pharmaceutical container comprising a lumen defined in part by a wall, the wall having an interior surface facing the lumen, an outer surface, and a coating set on the interior surface comprising a pH protective layer, wherein the pH protective layer is applied using atomic layer deposition.

30 Claims, 16 Drawing Sheets

ALD versus PECVD Coating Comparison

ALD Coating Stack

- pH Protective (ZrO₂)
- Barrier (Al₂O₃)
- Binder (Alumina)
- Polymer Container

PECVD Coating Stack

- pH Protective (SiOCH)
- Barrier (SiOx)
- Binder (SiOCH)
- Polymer Container

PHARMACEUTICAL CONTAINER WITH PH PROTECTIVE LAYER DEPOSITED BY ATOMIC LAYER DEPOSITION

CROSS-REFERENCE TO A RELATED APPLICATION

This patent application claims the benefit of U.S. Provisional Patent Application No. 63/550,319, filed Feb. 6, 2024, which is incorporated herein by reference in its entirety for all purposes.

BACKGROUND OF THE INVENTION

Pharmaceutical containers such as vials and syringes can have one or more barrier layers of material or materials on their interior walls, such layers being designed to protect the pharmaceutical agent—compound, biological, or other material, that is stored in the vial or syringe from contamination, such as from gases external to the containers or from the material of the containers themselves, which may degrade over time. In this manner, pharmaceutical containers may be delivered safely to an end-use location without excessive requirements for special handling during transport and storage, and the pharmaceutical agent would maintain its effectiveness even when transported and/or stored for extended periods of time. However, known barrier layers tend to degrade over time when in contact with some pharmaceutical agents and, as a result, the shelf life of such containers tend to be reduced.

Attempts have been made to reduce the degradation rate of the barrier layers with a view to develop pharmaceutical containers that provide long-term storage of stored pharmaceutical compositions. One such attempt includes incorporating a pH protective layer over the barrier layer. However, there remains an unmet need for a pharmaceutical container having a thin pH protective layer having an enhanced long-term storage of pharmaceutical agents. The invention disclosed herein provides such a pharmaceutical container. This and other advantages of the invention, as well as additional inventive features, will be apparent from the description of the invention provided herein.

BRIEF SUMMARY OF THE INVENTION

In one aspect, the invention provides a pharmaceutical container comprising a lumen defined in part by a wall, the wall having an interior surface facing the lumen, an outer surface, and a coating set on the interior surface comprising a pH protective layer, wherein the pH protective layer is applied using atomic layer deposition (ALD) technique.

The pharmaceutical container having a pH protective layer applied by the ALD technique in accordance with an aspect of the invention provides one or more technical advantages. For example, very thin pH protective layers can be applied by the ALD technique. In addition, the pH protective layer applied by this technique is very dense, and as a result, is capable of protecting the underlying gas barrier layer from undesirable pH exposure from the contents of the pharmaceutical container. Furthermore, the pharmaceutical container can be provided a thinner pH protective layer, e.g., the pH protective layer can be 20 nm to 50 nm, which is much less, up to 10 or 12 times less, than conventional thicknesses of about 250 to 400 nm. In addition, the mechanical properties of the pH protective layer applied by the ALD technique are such that the pH protective layer imparts substantial crack resistance and/or flexural strength to the barrier layer. Furthermore, the pH protective layer imparts thermal cycling resistance and/or mechanical deflection to the pharmaceutical container, particularly to the barrier layer. Alternatively, or in addition, since the pH protective layer and/or the barrier layer are very thin, it saves on the production time required in carrying out one or both of these steps during the production of the pharmaceutical container, especially considering that the pH protective layer is to built one atomic or molecular layer at a time by the ALD process. The pH protective layer reduces the rate of dissolution of the gas barrier layer by >90% when exposed to a pH of 3 to 9 at a temperature of 50° C. for 72 hours.

Further and alternative aspects and features of the disclosed invention will be apparent from the following detailed description. As will be appreciated, the methods disclosed herein are capable of being carried out and used in other and different aspects, and capable of being modified in various respects. Accordingly, it is to be understood that both the foregoing general description and the following detailed description are only exemplary and explanatory and do not restrict in any way the scope of the claimed invention.

DETAILED DESCRIPTION OF ASPECTS OF THE INVENTION

Figure 1A:
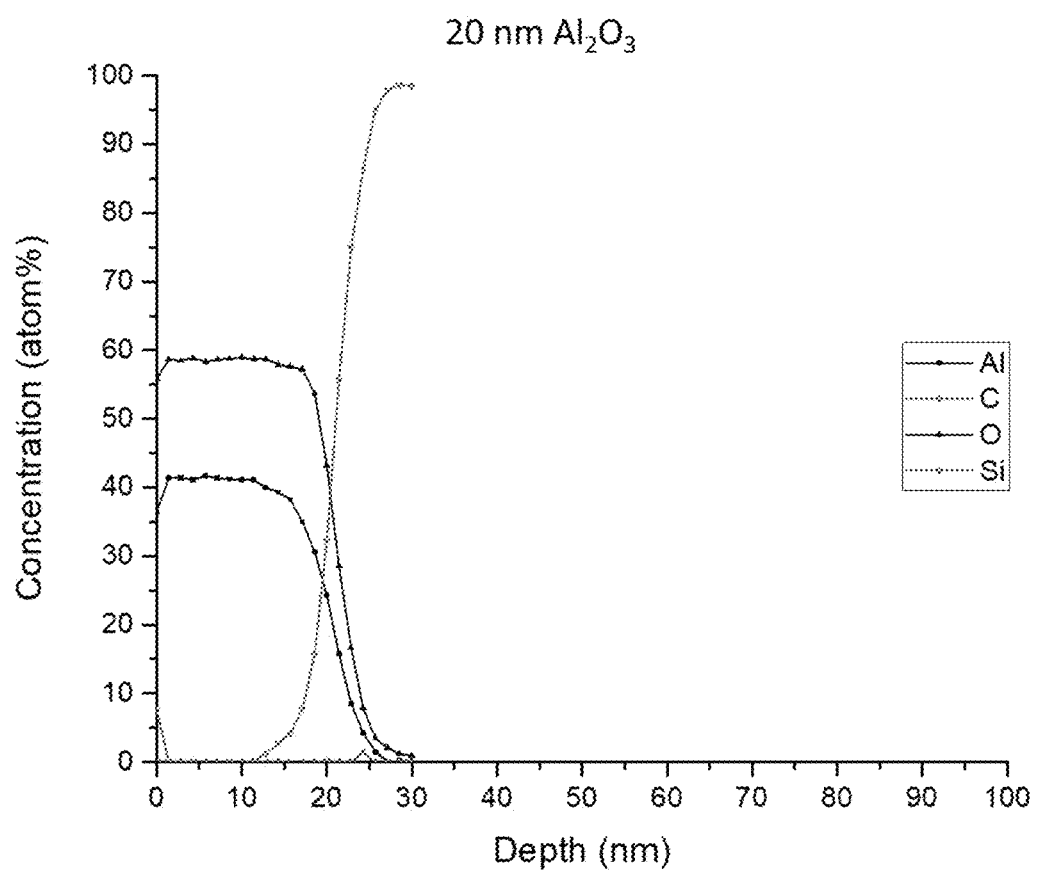
FIG. 1A is a graph demonstrating the x-ray photoelectron spectroscopy (XPS) depth profile of a silicon wafer coated with 20 nm thick $Al_2O_3$ coating. In this analysis, the concentrations of aluminum (Al), carbon (C), oxygen (O), and silicon (Si) were determined at various depths from the top surface of the wafer. The depth scale is estimated based on the $Al_2O_3$ rate.
Figure 1B:
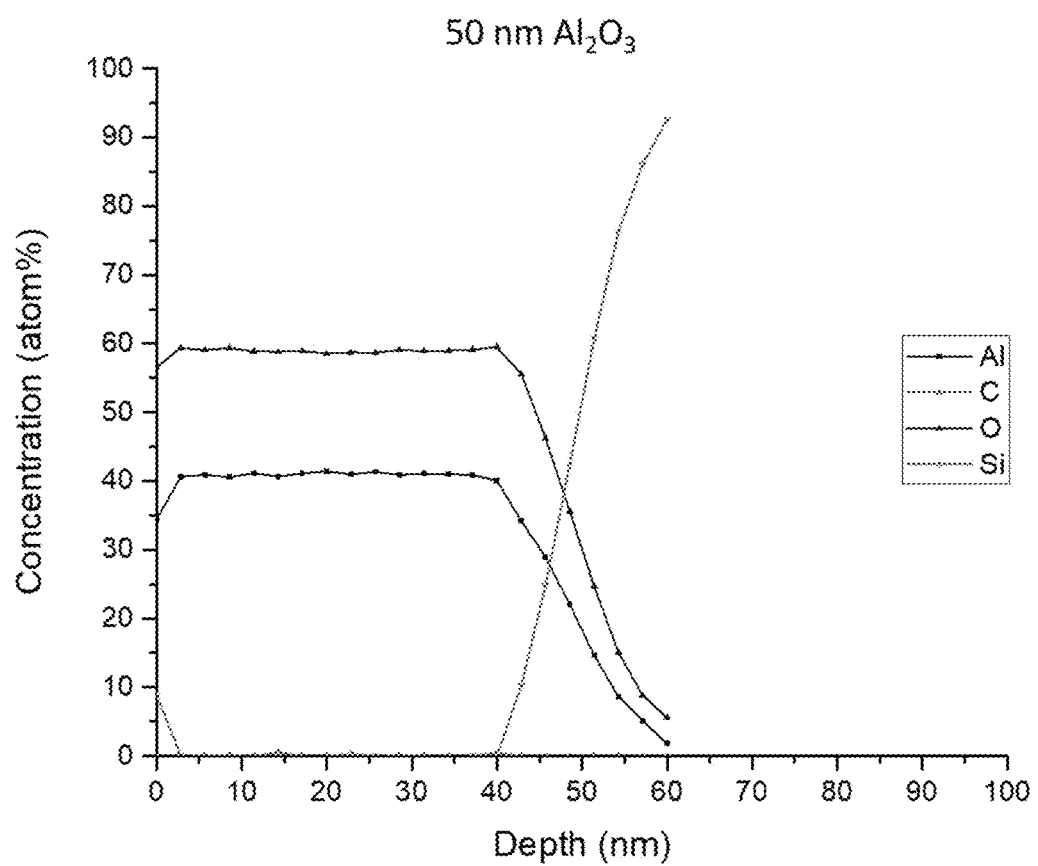
FIG. 1B is a graph demonstrating the XPS depth profile of a silicon wafer coated with 50 nm thick $Al_2O_3$ coating. In this analysis, the concentrations of aluminum (Al), carbon (C), oxygen (O), and silicon (Si) were determined at various depths. The depth scale is estimated based on the $Al_2O_3$ rate.
Figure 1C:
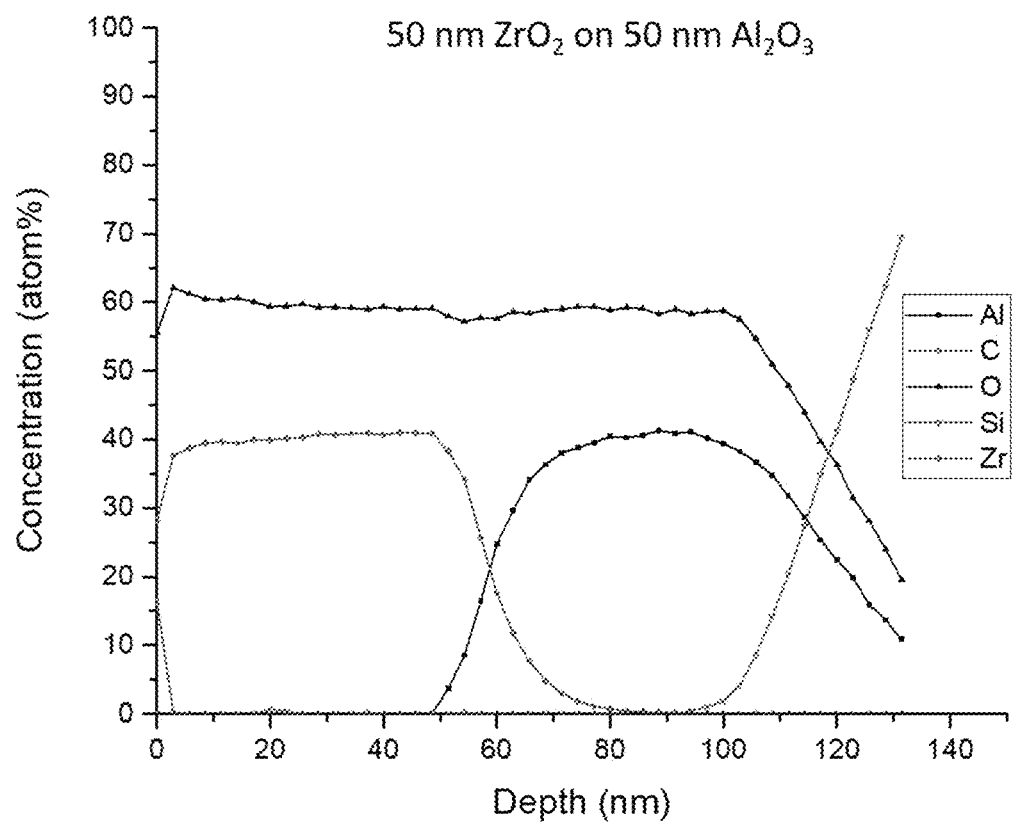
FIG. 1C is a graph demonstrating the XPS depth profile of a silicon wafer coated with 50 nm thick $ZrO_2$ coating over a 50 nm thick $Al_2O_3$ coating. In this analysis, the concentrations of aluminum (Al), carbon (C), oxygen (O), silicon (Si), and zirconium (Zr) were determined at various depths. The depth scale is estimated based on the $Al_2O_3$ rate.
Figure 1D:
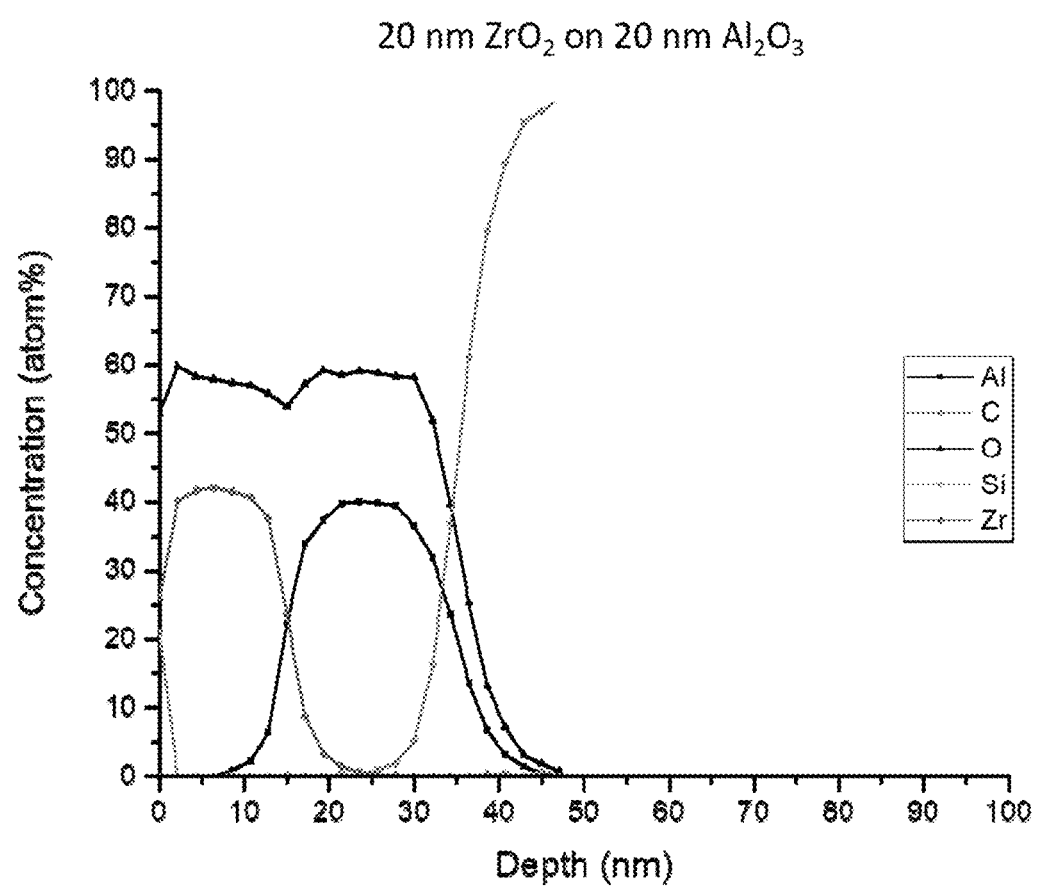
FIG. 1D is a graph demonstrating the XPS depth profile of a silicon wafer coated with 20 nm thick $Al_2O_3$ coating and a 20 nm thick $ZrO_2$ layer deposited over the $Al_2O_3$ coating. In this analysis the concentration of aluminum (Al), carbon (C), oxygen (O), silicon (Si), and zirconium (Zr) were determined at various depths. The depth scale is estimated based on the $Al_2O_3$ rate.
Figure 2A:
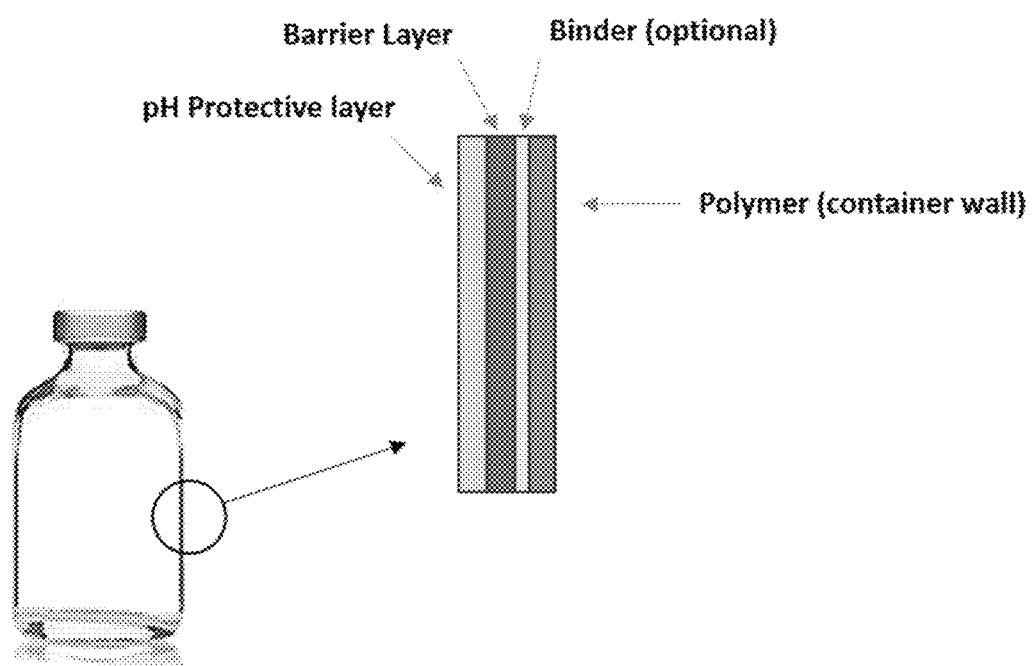
FIG. 2A is a schematic representation of a pharmaceutical container which demonstrates the pH protective layer, the barrier layer, and the optional binder layer deposited over a polymer substrate, wherein the pharmaceutical container is a vial.
Figure 2B:
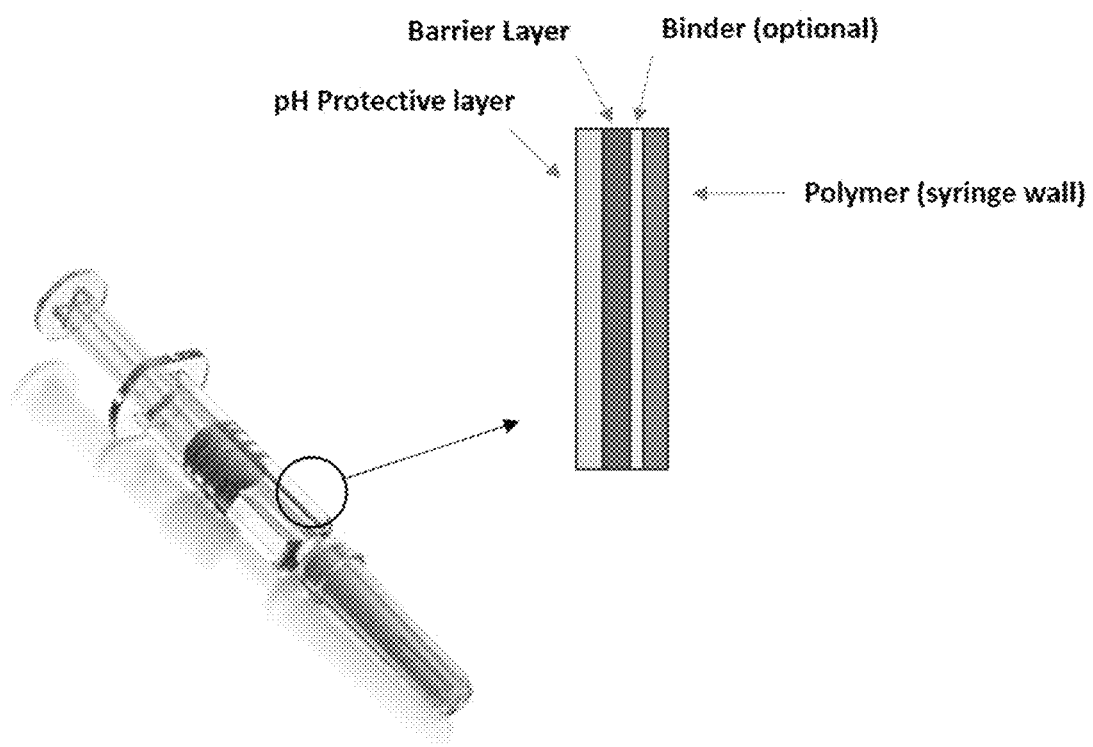
FIG. 2B is a schematic representation of a pharmaceutical container which demonstrates the pH protective layer, the barrier layer, and the optional binder layer deposited over a polymer substrate, wherein the pharmaceutical container is a syringe.

The invention provides a pharmaceutical container comprising a lumen defined in part by a wall, the wall having an interior surface facing the lumen, an outer surface, and a coating set on the interior surface comprising a pH protective layer, wherein the pH protective layer is applied using atomic layer deposition (ALD).

The invention relates in particular to coatings applied over an alumina barrier used in medical packaging. Although the present disclosure relates to any suitable packaging type where purity and stability of a stored material is critical for effectiveness, safety, and the like, in some aspects medical packaging in which an alumina barrier layer with an additional coating layer is applied may include a variety of vessels (e.g., including a lumen) such as vials, syringes (e.g., syringe barrels), blister packages, blood tubes, cartridges, bottles, stents, catheters, and the like.

In an aspect, the pharmaceutical container is a vial. For example, a vial will generally have an open mouth which may be sealed with a closure, wherein the contents of the vial may be accessed using a needle. Such vials are usually made of glass or plastic. In some aspects, the vial comprises polypropylene, cyclo olefin polymer, cyclo olefin co-polymer, polyethylene, or polyethylene terephthalate. Moreover, the closure of said vial may comprise an elastomer, such as vulcanized elastomers and styrenic block copolymer thermoplastic elastomers, but also natural rubber, acrylate-butadiene rubber, cis-polybutadiene, chloro or bromobutyl rubber, chlorinated polyethylene elastomers, polyalkylene oxide polymers, ethylene vinyl acetate, fluorosilicone rubbers, hexafluoropropylene-vinylidene fluoride-tetrafluoroethylene terpolymers, butyl rubbers, polyisobutene, synthetic polyisoprene rubber, silicone rubbers, styrene-butadiene rubbers, tetrafluoroethylene propylene copolymers, thermoplastic-copolyesters, thermo-plastic elastomers, or a combination thereof.

In another aspect, the pharmaceutical container is a syringe. For example, a syringe will generally have a cylindrical barrel made of glass or plastic, wherein the barrel of the syringe can be operated with a plunger in order to eject the contents of the barrel via the nozzle of the syringe. In some aspects, the syringe is composed of cyclic olefin polymers (COP), cyclic olefin co-polymers (COC), acrylonitrile butadiene styrene (ABS), polycarbonate (PC), polyoxymethylene (POM), polystyrene (PS), polybutylene terephthalate (PBT), polypropylene (PP), polyethylene (PE), polyamide (PA), thermoplastic elastomer (TPE), or combinations thereof. In some aspects, the plunger is composed of an elastomer, such as vulcanized elastomers and styrenic block copolymer thermoplastic elastomers, but also natural rubber, acrylate-butadiene rubber, cis-polybutadiene, chloro or bromobutyl rubber, chlorinated polyethylene elastomers, polyalkylene oxide polymers, ethylene vinyl acetate, fluorosilicone rubbers, hexafluoropropylene-vinylidene fluoride-tetrafluoroethylene terpolymers, butyl rubbers, polyisobutene, synthetic polyisoprene rubber, silicone rubbers, styrene-butadiene rubbers, tetrafluoroethylene propylene copolymers, thermoplastic-copolyesters, thermo-plastic elastomers, or a combination thereof. In some aspects, the syringe is pre-filled with a pharmaceutical composition, allowing for the quick administration of an exact dose to a patient. In some aspects, the pharmaceutical container comprises a syringe and a cartridge, wherein the cartridge is a specialized container that can be inserted into a pen or an auto-injector to act as a pharmaceutical delivery device.

In some aspects, the pharmaceutical container is a blister package. For example, a blister package may be used for packaging pharmaceuticals and medical devices such as solid dosage forms (tablets, capsules, etc.), transdermal patches, syringes, and the like. The blister package of the present invention comprises a bottom web substrate that is rigid and has one or more recesses that conform, in order stabilize the contents of the package. The blister package of the present invention also comprises a top web laminate, which is secured to the blister by heat seal and acts as a "lid" to allow access to the contents of the package.

The alumina barrier layer and coating may be applied to variety of materials used in such medical packaging, such as glass, plastics (e.g., thermoplastics), polymers, and ceramics. Accordingly, materials such as pharmaceuticals, vaccines, bodily fluids, compounds, biologics, and the like may be safely stored and transported in a variety of conditions while maintaining safety and effectiveness for far longer than with prior uncoated barrier layers.

In some aspects, the pharmaceutical container contains an oxygen barrier layer disposed on an inner wall of the container and a pH protective layer disposed on a gas barrier layer. In some aspects, the internal surface of the pharmaceutical container comprises a lumen.

In some aspects, the pharmaceutical container has a wall comprising a polymer. In some aspects, the wall of the pharmaceutical container can be composed of polypropylene, cyclo olefin polymer (COP), cyclo olefin co-polymer (COC), polyethylene, and/or polyethylene terephthalate. In some aspects, the cyclo olefin co-polymer can include copolymers of a cyclo olefin with ethylene or α-olefin, such as ethylene and norbornene or ethylene and tetracyclodecene. In some aspects, the cyclo olefin polymer or cyclo olefin copolymer comprises at least one cyclic olefin selected from cyclobutene, cyclopentene, cyclooctene, norbornene, 5-methylnorbornene, 3-methylnorbornene, ethylnorbornene, phenylnorbornene, dimethylnorbornene, diethylnorbornene, dicyclopentadiene, tetracycloclododecene, methyltetracyclododecene, 6-methylnorbornene, 6-ethylnorbornene, 6-n-butylnorbornene, 5-propylnorbornene, 1-methylnorbornene, 7-methylnorbornene, 5,6-di-methylnorbornene, 5-phenylnorbornene, 5-benzylic norbornene, 8-methyltetracyclo-3-dodecene, 8-ethyltetracyclo-3-dodecene, 8-hexyltetracyclo-3-dodecene, 2,10-dimethyltetracyclo-3-dodecene, and 5,10-dimethyltetracyclo-3-dodecene. In some aspects, the polymer is free of voids, defects, or holes.

For example, some such polymers are commercially available from Avient as Edgetek™, Polyplastics as TOPAS® (COC), Zeonex as ZEONOR® (COP), and Mitsui as APEL™ (COC). In some aspects, the cyclo olefin copolymer is Edgetek™ COC BLEND-15GF Natural (COC-GF15, Avient), TOPAS® 5013F-04 (COC, Polyplastics), TOPAS® 60135-04 (COC, Polyplastics), TOPAS® 5013L-10 (COC, Polyplastics), TOPAS® 6013F-04 (COC, Polyplastics), TOPAS® 6013M-07 (COC, Polyplastics), TOPAS® 60155-04 (COC, Polyplastics), TOPAS® 8007F-04 (COC, Polyplastics), TOPAS® 8007F-600 (COC, Polyplastics), TOPAS® 80075-04 (COC, Polyplastics), TOPAS® 8007X10 (COC, Polyplastics), TOPAS® 9506F-500 (COC, Polyplastics), Topas® 5013F-04 (COC, Topas), Topas® 5013L-10 (COC, Topas), Topas® 50135-04 (COC, Topas), Topas® 6013F-04 (COC, Topas), Topas® 6013M-07 (COC, Topas), Topas® 60155-04 (COC, Topas), Topas® 60175-04 (COC, Topas), Topas® 7010F-600 (COC, Topas), Topas® 8007F-04 (COC, Topas), Topas® 8007F-600 (COC, Topas), Topas® 80075-04 (COC, Topas), Topas® 8007X10 (COC, Topas), Topas® 9506F-500 (COC, Topas), Topas® 9903D-10 (COC, Topas), Topas® ELASTOMER E-140 (COC, Topas), APEL™ APL5014DP (COC, Mitsui Chemicals America), APEL™ APL5514ML (COC, Mitsui Chemicals America), APEL™ APL601IT (COC, Mitsui Chemicals America), APEL™ APL6013T (COC, Mitsui Chemicals America), APEL™ APL6015T (COC, Mitsui Chemicals America), APEL™ APL6509T (COC, Mitsui Chemicals America), APEL™ APL8008T (COC, Mitsui Chemicals America), or combinations thereof.

In some aspects the cyclo olefin polymer is Zeonex® 330R (COP, Zeon Corporation), Zeonex® 480 (COP, Zeon Corporation), Zeonex® 480R (COP, Zeon Corporation), Zeonex® 5000 (COP, Zeon Corporation), Zeonex® 690R (COP, Zeon Corporation), Zeonex® 790R (COP, Zeon Corporation), Zeonex® E48R (COP, Zeon Corporation), Zeonex® F52R (COP, Zeon Corporation), Zeonex® RS420 (COP, Zeon Corporation), Zeonor® 1020R (COP, Zeon Corporation), Zeonor® 1060R (COP, Zeon Corporation), Zeonor® 1420R (COP, Zeon Corporation), ARTON F4520 (COP, JSR Corporation), ARTON F3500 (COP, JSR Corporation), ARTON D4000 (COP, JSR Corporation), ARTON FBK80 (COP, JSR Corporation), ARTON R5000 (COP, JSR Corporation), ARTON RX4500 (COP, JSR Corporation), Zeonex® RS420-LDS (COP, Zeon Corporation), Zeonex® 350R (COP, Zeon Corporation), Zeonex® K26R (COP, Zeon Corporation), Zeonor® 1430R (COP, Zeon Corporation), or combinations thereof.

The COC or COP can have a density of 1000 kg/m$^3$ to 1030 kg/m$^3$ according to ISO 1183 or ASTM D 792, and preferably 1010 kg/m$^3$ and 1020 kg/m$^3$; a melt volume rate (MVR) according to ISO 1183 of 2 cm$^3$/10 min to 20 cm$^3$/10 min, preferably 4 cm$^3$/10 min and 13 cm$^3$/10 min; a melt flow rate (MFR, 260° C., 2.16 kg) according to ISO 1183 of 1 g/10 min to 20 g/10 min, preferably 3.6 g/10 min and 12 g/10 min; a melt flow rate (MFR, 280° C., 21.18N) according to JIS K6719 of 1 g/10 min to 20 g/10 min, preferably 6 g/10 min and 17 g/10 min; and/or a melt flow index (MFI, 280° C., 2.16 kg) according to ASTM D 1238 of 1 g/10 min to 20 g/10 min, preferably 6 g/10 min and 17 g/10 min.

The COC or COP can have a water absorption according to either ISO 62 or ASTM D570 of 0.03% or less, preferably 0.01% and 0.01% or less; a tensile modulus (1 mm/min) according to ISO 527-3 of 410 kpsi to 450 kpsi; preferably 420 kpsi and 440 kpsi; a flex modulus according to ASTM D790 of 2000 MPa to 2800 MPa, preferably 2200 MPa and 2600 MPa; a tensile stress at break (5 mm/min) according to ISO 527-3 of 8500 psi to 9300 psi, preferably 8700 psi and 9100 psi; a tensile strain at break (5 mm/min) according to ISO 527 of 2.3% to 2.8%, preferably 2.5% and 2.6%; a tensile strain at break (5 mm/min) according to ISO 527-3 of 5% to 25%, preferably 10% and 20%; a Charpy impact strength at 23° C. according to ISO 179/1 eU of 6.5 ft-lbs/in$^2$ to 7.35 ft-lbs/in$^2$, preferably 6.7 ft-lbs/in$^2$ and 7.1 ft-lbs/in$^2$; a glass transition temperature (10° C./min) according to ISO 11357-1, -2, -3 of 250° F. to 330° F., preferably 288° F. and 316° F.; a glass transition temperature according to JIS K7121 or ASTM E 1356 of 120° C. to 180° C., preferably 136° C. and 163° C.; a degree of light transmittance according to ISO 13468-2 or ASTM D1003 (3 mm) of 90% to 95%, preferably 91% and 92%; and/or a heat distortion temperature according to JIS D648 of 120° C. to 180° C. preferably 136° C. and 161° C.

The pH barrier layer can be applied by any suitable method, particularly, by the atomic layer deposition (ALD) method. ALD is based on typically self-limiting reactions, whereby sequential and alternating pulses of reactants are utilized to deposit one monolayer of deposit per cycle. The deposition conditions and precursors are chosen to provide self-saturating reactions, such that an adsorbed layer of one reactant leaves a surface termination that is non-reactive with the vapor phase reactants of the same reactant. The substrate surface is subsequently contacted with a different reactant that reacts with the previous termination to enable continued deposition. Thus, each cycle of alternating pulsed reactants generally leaves no more than about one monolayer of the desired material. See, for example, U.S. Pat. No. 11,244,825 B2, Di Mauro et al., *Applied Catalysis B: Environmental* 196 (2016) 68-76; Ahmed et al., *AIP Advances* 14, 035133 (2024), and Oviroh et al., *Science and Technology of Advanced Materials*, 20(1): 465-496 (2019) for procedures involving atomic layer deposition.

ALD is a coating deposition technology that yields exceptional conformity and allows for tunable coating compositions, wherein the coating thicknesses can be controlled at the atomic level. ALD operates via chemical reactions of two or more precursors which are added into a chamber where a substrate is placed at a given temperature and pressure to enable the deposition of a material on the surface of a substrate layer by layer. While traditional techniques such as chemical vapor deposition (CVD) rely on high temperatures to decompose the precursor at the surface of the substrate, ALD can be performed at lower temperatures. Moreover, when compared to CVD and physical vapor deposition (PVD), ALD can produce high quality coatings with conformality and uniformity and is highly reproducible and easily scalable to industrial process level. In certain aspects, plasma enhanced atomic layer deposition may be used to deposit the barrier layer or pH protective layer at lower temperatures.

In some aspects, the pH barrier layer may be a compound of aluminum and oxygen, such as alumina ($Al_2O_3$) or $Al_3O_5$ (e.g., each compound is an "aluminum oxide"). The barrier layer may be applied to the packaging or a portion thereof utilizing a process such as atomic layer deposition, and including other precursor steps and binding layers as necessary, to constantly apply an aluminum oxide coating having a desired deposition pattern, thickness, consistency, and other desirable properties for a particular application.

The barrier layer of the present invention is deposited using atomic layer deposition at a temperature of 200° C. or less, e.g., 195° C. or less, 190° C. or less, 185° C. or less, 180° C. or less, 175° C. or less, 170° C. or less, 165° C. or less, 160° C. or less, 155° C. or less, 150° C. or less, 145° C. or less, 140° C. or less, 135° C. or less, 130° C. or less, 125° C. or less, 120° C. or less, 115° C. or less, 110° C. or less, 105° C. or less, 100° C. or less, 95° C. or less, 90° C. or less, 85° C. or less, 80° C. or less, 75° C. or less, 70° C. or less, 65° C. or less, 60° C. or less, 55° C. or less, 50° C. or less, 45° C. or less, or 40° C. or less. In some aspects, the gas barrier layer is applied by atomic layer deposition at a temperature that is less than the Tg of the material comprising the pharmaceutical container.

The pH barrier layer of the present invention has a thickness of 50 nm or less, e.g., 50 nm or less, 45 nm or less, 40 nm or less, 35 nm or less, 30 nm or less, 25 nm or less, 20 nm or less, 15 nm or less, 10 nm or less, or 5 nm or less.

The pharmaceutical container of the present invention may comprise a binding layer. In some aspects, the binding layer comprises alumina and is deposited between the barrier layer and the lumen. In certain aspects the binding layer is deposited using atomic layer deposition at a temperature of 100° C. or less, e.g., 95° C. or less, 90° C. or less, 85° C. or less, 80° C. or less, 75° C. or less, 70° C. or less, 65° C. or less, 60° C. or less, 55° C. or less, 50° C. or less, 45° C. or less, or 40° C. or less.

In some aspects, the pH protective layer of the present invention is deposited over the barrier layer and may be titanium oxide (e.g. $TiO_2$), zirconium oxide (e.g., $ZrO_2$ or zirconia), magnesium oxide (e.g., MgO or magnesia), or variation and combinations thereof, which are applied over the aluminum oxide barrier layer using atomic layer deposition.

In some aspects, the titanium dioxide may be applied in its naturally occurring format. In some aspects, the titanium dioxide is deposited by an ALD process by utilizing tetrakis (dimethylamino) titanium (TDMAT), tetrakis(diethylamino) titanium (TDEAT), or tetrakis(ethylmethylamino) titanium (TEMAT) or a combination thereof, as reactant or reactants.

In some aspects, the titanium dioxide precursor requires a process temperature of greater than 225° C. In some aspects, the titanium dioxide precursors are used with water or ozone oxidizers.

In some aspects, the zirconium dioxide is deposited by an ALD process by utilizing tetrakisdimethylamidozirconium ($Zr(NMe_2)_4$), tetrakisethylmethylamidozirconium $Zr(NMeEt)_4$, or tetrakisdiethylamidozirconium $Zr(NEt_2)_4$, or a combination thereof, as reactant or reactants.

In some aspects, the magnesium oxide is deposited by an ALD process by utilizing $Mg(thd)_2$ (2,2,6,6-tetramethyl-3, 5-heptanedionate magnesium), $Mg(Cp)_2$ (bis(cyclopentadienyl)magnesium), or $Mg(EtCp)_2$ (bis(ethylcyclopentadienyl)magnesium), or a combination thereof, as reactant or reactants.

The pH protective layer of the present invention is deposited using atomic layer deposition at a temperature of 200° C. or less, e.g., 195° C. or less, 190° C. or less, 185° C. or less, 180° C. or less, 175° C. or less, 170° C. or less, 165° C. or less, 160° C. or less, 155° C. or less, 150° C. or less, 145° C. or less, 140° C. or less, 135° C. or less, 130° C. or less, 125° C. or less, 120° C. or less, 115° C. or less, 110° C. or less, 105° C. or less, 100° C. or less, 95° C. or less, 90° C. or less, 85° C. or less, 80° C. or less, 75° C. or less, 70° C. or less, 65° C. or less, 60° C. or less, 55° C. or less, 50° C. or less, 45° C. or less, or 40° C. or less. In some aspects, the pH protective layer is applied by atomic layer deposition at a temperature that is less than the Tg of the material comprising the pharmaceutical container.

The pH protective layer of the present invention has a thickness of 50 nm or less, e.g., 45 nm or less, 40 nm or less, 35 nm or less, 30 nm or less, 25 nm or less, 20 nm or less, 15 nm or less, 10 nm or less, or 5 nm or less.

In some aspects, the thicknesses of the barrier layer and pH protective layer are measured using transmission electron microscopy (TEM) or x-ray photoelectron spectroscopy (XPS).

The pharmaceutical container of the present application is suitable for holding a pharmaceutical composition. In some aspects, the pharmaceutical composition has a pH of from 3 to 12, e.g., 3.5, 4, 4.5, 5, 5.5, 6, 6.5, 7, 7.5, 8, 8.5, 9, 9.5, 10, 10.5, 11, or 11.5. In some aspects the pharmaceutical composition comprises a peptide, protein, monoclonal antibody, or a constituent of blood.

In other aspects the pharmaceutical composition comprises a biologic drug, for example, a biologic drug selected from abatacept; abciximab; abobotulinumtoxinA; adalimumab; adalimumab-adaz; adalimumab-adbm; adalimumab-afzb; adalimumab-atto; adalimumab-bwwd; ado-trastuzumab emtansine; aflibercept; agalsidase beta; albiglutide; albumin chromated CR-51 serum; aldesleukin; alefacept; alemtuzumab; alglucosidase alfa; alirocumab; alteplase; anakinra; aprotinin; asfotas alfa; asparaginase; asparaginase *Erwinia chrysanthemi*; atezolizumab; avelumab; basiliximab; becaplermin; belatacept; belimumab; benralizumab; beractant; bevacizumab; bevacizumab-awwb; bevacizumab-bvzr; bezlotoxumab; blinatumomab; brentuximab vedotin; brodalumab; brolucizumab-dbll; burosumab-twza; calaspargase pegol-mknl; calfactant; canakinumab; caplacizumab-yhdp; capromab pendetide; cemiplimab-rwlc; cenegermin-bkbj; cerliponase alfa; certolizumab pegol; cetuximab; choriogonadotropin alfa; chorionic gonadotropin; chymopapain; collagenase; collagenase *Clostridium histolyticum*; corticorelin ovine triflutate; crizanlizumab-tmca; daclizumab; daratumumab; daratumumab and hyaluronidase-fihj; darbepoetin alpha; denileukin diftitox; denosumab; desirudin; dinutuximab; dornase alfa; drotrecogin alfa; dulaglutide; dupilumab; durvalumab; ecallantide; eculizumab; efalizumab; elapegademase-lvlr; elosulfase alfa; elotuzumab; emapalumab-lzsg; emicizumab-kxwh; enfortumab vedotin-ejfv; epoetin alfa; epoetin alfa-epbx; erenumab-aooe; etanercept; etanercept-szzs; etanercept-ykro; evolocumab; fam-trastuzumab deruxetecan-nxki; fibrinolysin and desoxyribonuclease combined [bovine], with chloramphenicol; filgrastim; filgrastim-aafi; filgrastim-sndz; follitropin alfa; follitropin beta; fremanezumab-vfrm; galcanezumab-gnlm; galsulfase; gemtuzumab ozogamicin; glucarpidase; golimumab; guselkumab; hyaluronidase; hyaluronidase human; ibalizumab-uiyk; ibritumomab tiuxetan; idarucizumab; idursulfase; imiglucerase; incobotulinumtoxinA; inebilizumab-cdon; infliximab; infliximab-abda; infliximab-axxq; infliximab-dyyb; infliximab-qbtx; inotuzumab ozogamicin; insulin aspart; insulin aspart protamine and insulin aspart; insulin degludec; insulin degludec and insulin aspart; insulin degludec and liraglutide; insulin detemir; insulin glargine; insulin glargine and lixisenatide; insulin glulisine; insulin human; insulin isophane human; insulin isophane human and insulin human; insulin lispro; insulin lispro protamine and insulin lispro; insulin lispro-aabc; interferon alfa-2a; interferon alfa-2b; interferon alfacon-1; interferon alfa-n3 (human leukocyte derived); interferon beta-1 a; interferon beta-1 b; interferon gamma-1 b; ipilimumab; isatuximab-irfc; ixekizumab; lanadelumab-flyo; laronidase; lixisenatide; luspatercept-aamt; mecasermin; mecasermin rinfabate; menotropins; mepolizumab; methoxy polyethylene glycol-epoetin beta; metreleptin; mogamulizumab-kpkc; moxetumomab pasudotox-tdfk; muromanab-CD3; natalizumab; necitumumab; nivolumab; nofetumomab; obiltoxaximab; obinutuzumab; ocrelizumab; ocriplasmin; ofatumumab; olaratumab; omalizumab; onabotulinumtoxinA; oprelvekin; palifermin; palivizumab; pancrelipase; panitumumab; parathyroid hormone; pegademase bovine; pegaspargase; pegfilgrastim; pegfilgrastim-apgf; pegfilgrastim-bmez; pegfilgrastim-cbqv; pegfilgrastim-jmdb; peginterferon alfa-2a; peginterferon alfa-2a and ribavirin; peginterferon alfa-2b; peginterferon alfa-2b and ribavirin; peginterferon beta-1 a; pegloticase; pegvaliase-pqpz; pegvisomant; pembrolizumab; pertuzumab; polatuzumab vedotin-piiq; poractant alfa; prabotulinumtoxinA-xvfs; radiolabeled albumin technetium Tc-99m albumin colloid kit; ramucirumab; ranibizumab; rasburicase; ravulizumab-cwvz; raxibacumab; reslizumab; reteplase; rilonacept; rimabotulinumtoxinB; risankizumab-rzaa; rituximab; rituximab and hyaluronidase human; rituximab-abbs; rituximab-pvvr; romiplostim; romosozumab-aqqg; sacituzumab govitecan-hziy; sacrosidase; sargramostim; sarilumab; sebelipase alfa; secukinumab; siltuximab; somatropin; tagraxofusp-erzs; taliglucerase alfa; tbo-filgrastim; technetium 99m tc fanolesomab; tenecteplase; teprotumumab-trbw; tesamorelin acetate; thyrotropin alfa; tildrakizumab-asmn; tocilizumab; tositumomab and iodine 1-131 tositumomab; trastuzumab; trastuzumab and hyaluronidase-oysk; trastuzumab-anns; trastuzumab-dkst; trastuzumab-dttb; trastuzumab-pkrb; trastuzumab-qyyp; urofollitropin; urokinase; ustekinumab; vedolizumab; velaglucerase alfa; vestronidase alfa-vjbk; Ziv-Aflibercept; Amjevita (adalimumab-atto); Dupixent (dupilumab); Fulphila (pegfilgrastim-jmdb); Ilaris (canakinumab); Ixifi (infliximab-qbtx); Lyumjev (insulin lispro-aabc); Nyvepria (pegfilgrastim-apgf); Ogivri (trastuzumab-dkst); Semglee (insulin glargine); Uplizna (inebilizumab-cdon); A.P.L. (chorionic gonadotropin); Abrilada (adalimumab-afzb); Aduhelm (aducanumab-avwa); Accretropin (somatropin); Actemra (tocilizumab); Acthrel (corticorelin ovine triflutate); Actimmune (interferon gamma-1 b); Activase (alteplase); Adagen (pegademase bovine); Adakveo (crizanlizumab-tmca); Adbry (tralokinumab-ldrm); Adcetris (brentuximab vedotin); Adlyxin (lixisenatide); Admelog (insulin lispro); Afrezza (insulin human); Aimovig (erenumab-aooe); Ajovy (fremanezumab-vfrm); Aldurazyme (laronidase); Alferon N Injection (interferon alfa-n3 (human leukocyte derived)); Amevive (alefacept); Amphadase (hyaluronidase); Anthim (obiltoxaximab); Apidra (insulin glulisine); Aranesp (darbepoetin alpha); Arcalyst (rilonacept); Arzerra (ofatumumab); Asparlas (calaspargase pegol-mknl); Avastin (bevacizumab); Avonex (interferon beta-1 a); Avsola (infliximab-axxq); Basaglar (insulin glargine); Bavencio (avelumab); Benlysta (belimumab); Beovu (brolucizumab-dbll); Besponsa (inotuzumab ozogamicin); Besremi (ropeginterferon-alfa-2b-njft); Betaseron (interferon beta-1 b); Bexxar (tositumomab and iodine 1-131 tositumomab); Beyfortus (nirsevimab-alip); Bimzelx (bimekizumab); Blincyto (blinatumomab); Botox (onabotulinumtoxinA); Botox Cosmetic (onabotulinumtoxinA); Bravelle (urofollitropin); Brineura (cerliponase alfa); Briumvi (ublituximab-xiiy); Cablivi (caplacizumab-yhdp); Campath (alemtuzumab); Cathflo Activase (alteplase); Cerezyme (imiglucerase); Chorionic Gonadotropin (chorionic gonadotropin); Chromalbin (albumin chromated CR-51 serum); Chymodiactin (chymopapain); Cimzia (certolizumab pegol); Cinqair (reslizumab); Columvi (glofitamab-gxbm); Cosentyx (secukinumab); Cotazym (pancrelipase); Creon (pancrelipase); Crysvita (burosumab-twza); Curosurf (poractant alfa); Cyltezo (adalimumab-adbm); Cyramza (ramucirumab); Darzalex (daratumumab); Darzalex Faspro (daratumumab and hyaluronidase-fihj); Daxxify (daxibotulinumtoixna-lanm); Draximage MAA (kit for the preparation of technetium Tc-99m albumin aggregated); Dysport (abobotulinumtoxinA); Egrifta (tesamorelin acetate); Egrifta SV (tesamorelin acetate); Elahere (mirvetuximab soravtansine-gynx); Elaprase (idursulfase); Elase-chloromycetin (fibrinolysin and desoxyribonuclease combined [bovine], with chloramphenicol); Elelyso (taliglucerase alfa); Elfabrio (pegunigalsidase alfa-iwxj); Elitek (rasburicase); Elrexfio (elranatamab-bcmm); Elspar (asparaginase); Elzonris (tagraxofusp-erzs); Emgality (galcanezumab-gnlm); Empliciti (elotuzumab); Enbrel (etanercept); Enbrel Mini (etanercept); Enhertu (fam-trastuzumab deruxetecan-nxki); Enjaymo (sutimlimab-jome); Entyvio (vedolizumab); Epkinly (epcoritamab-bysp); Epogen/Procrit (epoetin alfa); Erbitux (cetuximab); Erelzi (etanercept-szzs); Erelzi Sensoready (etanercept-szzs); Erwinaze (asparaginase *Erwinia chrysanthemi*); Eticovo (etanercept-ykro); Evenity (romosozumab-aqqg); Evkeeza (evinacumab-dgnb), Extavia (interferon beta-1 b); Eylea (aflibercept); Fabrazyme (agalsidase beta); Fasenra (benralizumab); Fiasp (insulin aspart); Follistim (follitropin beta); Follistim AQ (follitropin beta); Follistim AQ Cartridge (follitropin beta); Gamifant (emapalumab-lzsg); Gazyva (obinutuzumab); Genotropin (somatropin); Gonal-f (follitropin alfa); Gonal-f RFF (follitropin alfa); Gonal-f RFF RediJect (follitropin alfa); Granix (tbo-filgrastim); Hadlima (adalimumab-bwwd); Hemlibra (emicizumab-kxwh); Herceptin (trastuzumab); Herceptin Hylecta (trastuzumab and hyaluronidase-oysk); Herzuma (trastuzumab-pkrb); Humalog (insulin lispro); Humalog Mix 50/50 (insulin lispro protamine and insulin lispro); Humalog Mix 75/25 (insulin lispro protamine and insulin lispro); Humatrope (somatropin); Humegon (menotropins); Humira (adalimumab); Humulin 70/30 (insulin isophane human and insulin human); Humulin N (insulin isophane human); Humulin R U-100 (insulin human);

Humulin R U-500 (insulin human); Hydase (hyaluronidase); Hylenex recombinant (hyaluronidase human); Hyrimoz (adalimumab-adaz); llumya (tildrakizumab-asmn); Imfinzi (durvalumab); Imjudo (tremelimumab-actl); Increlex (mecasermin); Infasurf (calfactant); Infergen (interferon alfa-con-1); Inflectra (infliximab-dyyb); Intron A (interferon alfa-2b); Iplex (mecasermin rinfabate); Iprivask (desirudin); Jeanatope (kit for iodinated 1-125 albumin); Jemperli (dostarlimab-gxly); Jetrea (ocriplasmin); Jeuveau (prabotulinumtoxinA-xvfs); Kadcyla (ado-trastuzumab emtansine); Kalbitor (ecallantide); Kanjinti (trastuzumab-anns); Kanuma (sebelipase alfa); Kepivance (palifermin); Kevzara (sarilumab); Keytruda (pembrolizumab); Kimmtrak (tebentafusp-tebn); Kineret (anakinra); Kinlytic (urokinase); Krystexxa (pegloticase); Lamzede (velmanase alfa-tycv); Lantus (insulin glargine); Lartruvo (olaratumab); Lemtrada (alemtuzumab); Leqembi (lecanemab-irmb); Leukine (sargramostim); Levemir (insulin detemir); Libtayo (cemiplimab-rwlc); Loqtorzi (toripalimab-tpzi); Lucentis (ranibizumab); Lumizyme (alglucosidase alfa); Lumoxiti (moxetumomab pasudotox-tdfk); Lunsumio (mosunetuzumab-axgb); Macrotec (kit for the preparation of technetium Tc-99m albumin aggregated); Megatope (kit for iodinated 1-131 albumin); Menopur (menotropins); Mepsevii (vestronidase alfa-vjbk); Microlite (radiolabeled albumin technetium Tc-99m albumin colloid kit); Mircera (methoxy polyethylene glycol-epoetin beta); Mvasi (bevacizumab-awwb); Myalept (metreleptin); Mylotarg (gemtuzumab ozogamicin); Myobloc (rimabotulinumtoxinB); Myozyme (alglucosidase alfa); Myxredlin (insulin human); N/A (raxibacumab); Naglazyme (galsulfase); Natpara (parathyroid hormone); Neulasta (pegfilgrastim); Neulasta Onpro (pegfilgrastim); Neumega (oprelvekin); Neupogen (filgrastim); NeutroSpec (technetium 99m tc fanolesomab); Nexobrid (anacaulase-bcdb); Nexviazyme (avalglucosidase alfa-ngpt); Ngenla (somatrogon-ghla); Nivestym (filgrastim-aafi); Norditropin (somatropin); Novarel (chorionic gonadotropin); Novolin 70/30 (insulin isophane human and insulin human); Novolin N (insulin isophane human); Novolin R (insulin human); Novolog (insulin aspart); Novolog Mix 50/50 (insulin aspart protamine and insulin aspart); Novolog Mix 70/30 (insulin aspart protamine and insulin aspart); Nplate (romiplostim); Nucala (mepolizumab); Nulojix (belatacept); Nutropin (somatropin); Nutropin AQ (somatropin); Ocrevus (ocrelizumab); Omnitrope (somatropin); Omvoh (mirikizumab-mrkz); Oncaspar (pegaspargase); Ontak (denileukin diftitox); Ontruzant (trastuzumab-dttb); Opdivo (nivolumab); Opdualag (nivolumab and relatlimab-rmbw); Orencia (abatacept); Orthoclone OKT3 (muromanab-CD3); Ovidrel (choriogonadotropin alfa); Oxervate (cenegermin-bkbj); Padcev (enfortumab vedotin-ejfv); Palynziq (pegvaliase-pqpz); Pancreaze (pancrelipase); Pegasys (peginterferon alfa-2a); Pegasys Copegus Combination Pack (peginterferon alfa-2a and ribavirin); Pegintron (peginterferon alfa-2b); Peglntron/Rebetol Combo Pack (peginterferon alfa-2b and ribavirin); Pergonal (menotropins); Perjeta (pertuzumab); Pertzye (pancrelipase); Plegridy (peginterferon beta-1 a); Polivy (polatuzumab vedotin-piiq); Pombiliti (cipaglucosidase alfa-atga); Portrazza (necitumumab); Poteligeo (mogamulizumab-kpkc); Praluent (alirocumab); Praxbind (idarucizumab); Pregnyl (chorionic gonadotropin); Procrit (epoetin alfa); Proleukin (aldesleukin); Prolia (denosumab); ProstaScint (capromab pendetide); Pulmolite (kit for the preparation of technetium Tc-99m albumin aggregated); Pulmotech MAA (kit for the preparation of technetium Tc-99m albumin aggregated); Pulmozyme (dornase alfa); Raptiva (efalizumab); Rebif (interferon beta-1 a); Reblozyl (luspatercept-aamt); Regranex (becaplermin); Remicade (infliximab); Renflexis (infliximab-abda); Reopro (abciximab); Repatha (evolocumab); Repronex (menotropins); Retacrit (epoetin alfa-epbx); Retavase (reteplase); Revcovi (elapegademase-lvlr); Rituxan (rituximab); Rituxan Hycela (rituximab and hyaluronidase human); Roferon-A (interferon alfa-2a); Rolvedon (eflapegrastim-xnst); Ruxience (rituximab-pvvr); Rybrevant (amivantamab-vmjw); Rylaze (asparaginase *Erwinia chrysanthemi* (recombinant)-rywn); Ryzneuta; Rystiggo (rozanolixizumab-noli); Ryzodeg 70/30 (insulin degludec and insulin aspart); Saizen (somatropin); Santyl (collagenase); Saphnelo (anifrolumab-fnia); Sarclisa (isatuximab-irfc); Serostim (somatropin); Siliq (brodalumab); Simponi (golimumab); Simponi Aria (golimumab); Simulect (basiliximab); Skyrizi (risankizumab-rzaa); Skytrofa (lonapegsomatropin-tcgd); Soliqua 100/33 (insulin glargine and lixisenatide); Soliris (eculizumab); Somavert (pegvisomant); Spevigo (spesolimab-sbzo); Stelara (ustekinumab); Strensiq (asfotas alfa); Sucraid (sacrosidase); Survanta (beractant); Susvimo (ranibizumab); Sylvant (siltuximab); Synagis (palivizumab); Takhzyro (lanadelumab-flyo); Taltz (ixekizumab); Talvey (talquetamab-tgvs); Tanzeum (albiglutide); Tecentriq (atezolizumab); Tecvayli (teclistamab-cqyv); Tepezza (teprotumumab-trbw); Tezspire (tezepelumab-ekko); Thyrogen (thyrotropin alfa); Tivdak (tisotumab vedotin-tftv); TNKase (tenecteplase); Toujeo (insulin glargine); Trasylol (aprotinin); Trazimera (trastuzumab-qyyp); Tremfya (guselkumab); Tresiba (insulin degludec); Trodelvy (sacituzumab govitecan-hziy); Trogarzo (ibalizumab-uiyk); Trulicity (dulaglutide); Truxima (rituximab-abbs); Tysabri (natalizumab); Tzield (teplizumab-mzwv); Udenyca (pegfilgrastim-cbqv); Ultomiris (ravulizumab-cwvz); Unituxin (dinutuximab); Vabysmo (faricimab-svoa); Vectibix (panitumumab); Veopoz (pozeilimab-bbfg); Verluma (nofetumomab); Vimizim (elosulfase alfa); Viokace (pancrelipase); Vitrase (hyaluronidase); Voraxaze (glucarpidase); VPRIV (velaglucerase alfa); Vyvgart (efgartigimod alfa-fcab); Vyvgart Hytrulo (efgartigimod alfa and hyaluronidase-qvfc); Xenpozyme (olipudase alfa-rpcp); Xeomin (incobotulinumtoxinA); Xgeva (denosumab); Xiaflex (collagenase *Clostridium histolyticum*); Xigris (drotrecogin alfa); Xolair (omalizumab); Xultophy 100/3.6 (insulin degludec and liraglutide); Yervoy (ipilimumab); Zaltrap (Ziv-Aflibercept); Zarxio (filgrastim-sndz); Zenapax (daclizumab); Zenpep (pancrelipase); Zevalin (ibritumomab tiuxetan); Ziextenzo (pegfilgrastim-bmez); Zinbryta (daclizumab); Zinplava (bezlotoxumab); Zirabev (bevacizumab-bvzr); Zomacton (somatropin); Zorbtive/Serostim (somatropin); Zymfentra (infliximab); Zynlonta (locastuximab tesirine-lpyl); or Zynyz (retifanlimab-dlwr).

Aspects of the invention described herein may be beneficial alone or in combination, with one or more other aspects. Without limiting the foregoing description, certain non-limiting aspects numbered 1-15 are provided below. As will be apparent to those of skill in the art upon reading this disclosure, each of the individually numbered aspects may be used or combined with any of the preceding or following individually numbered aspects. This is intended to provide support for all such combinations of aspects and is not limited to combinations of aspects explicitly provided below:

(1) A packaging for delivery of a material, comprising: an internal surface of the packaging; a barrier layer applied over at least a portion of the internal surface; and a coating layer applied over the barrier layer.

(2) The packaging of aspect (1), wherein the barrier layer comprises an aluminum oxide.

(3) The packaging of aspect (2), wherein the aluminum oxide comprises $Al_2O_3$ or $Al_3O_5$.

(4) The packaging of aspect (2), wherein the coating layer comprises zirconium dioxide or magnesium oxide.

(5) The packaging of aspect (4), wherein the coating layer comprises zirconium dioxide and wherein the zirconium dioxide comprises $ZrO_2$.

(6) The packaging of aspect (4), wherein the coating layer comprises magnesium oxide and wherein the magnesium oxide comprises MgO.

(7) The packaging of aspect (1), wherein the packaging comprises a vial, a syringe, a blister package, a blood tube, a cartridge, a bottle, a stent, or a catheter.

(8) The packaging of aspect (7), wherein the material comprises a vaccine, a pharmaceutical, a bodily fluid, or a biological.

(9) The packaging of aspect (1), wherein the application of the barrier layer comprises atomic layer deposition ("ALD").

(10) The packaging of aspect (9), wherein the application of coating layer comprises ALD.

(11) The packaging of aspect (1), further comprising a tying layer between the barrier layer and the internal surface.

(12) The packaging of aspect (1), wherein the internal surface comprises a lumen.

(13) The packaging of aspect (1), wherein at least a portion of the internal surface comprises an entirety of the internal surface.

(14) The packaging of aspect (1), wherein the application of the coating layer entirely covers the barrier layer such that none of the barrier layer is exposed to the material.

(15) In aspect (15) is presented a method for applying a protective coating to packaging for a material, comprising: applying, over an internal surface of the packaging an aluminum oxide barrier layer; and applying, over the aluminum oxide barrier layer, a coating layer of zirconium dioxide or magnesium oxide.

EXAMPLES

These following examples further illustrate the invention but, of course, should not be construed as in any way limiting its scope.

Example 1

This example illustrates a method for preparing a pH protective coating layer by the atomic layer deposition (ALD) technique. Thus, pH protective layers were applied on a silicon wafer containing an $Al_2O_3$ barrier layer that served as a model for the surface of the pharmaceutical container.

Thus, pH protective layers were applied onto the following silicon wafers (each 1 cm×1 cm): (i) a Si wafer with a 20 nm $Al_2O_3$ barrier layer, (ii) a Si wafer with a 50 nm $Al_2O_3$ barrier layer, (iii) a 50 nm $ZrO_2$ pH protective layer deposited over the 50 nm $Al_2O_3$ barrier layer, and (iv) a Si wafer with a 20 nm $Al_2O_3$ barrier layer and a 20 nm $ZrO_2$ pH protective layer deposited over the 20 nm $Al_2O_3$ barrier layer.

The samples were evaluated to determine the coating stack in several locations on the Si wafer using XPS. XPS experiments were performed using a Physical Electronics VersaProbe III instrument equipped with a monochromatic Al kα x-ray source (hv=1,486.6 eV) and a concentric hemispherical analyzer. Charge neutralization was performed using both low energy electrons (<5 eV) and argon ions. The binding energy axis was calibrated using sputter cleaned Cu (Cu $2p_{3/2}$=932.62 eV, Cu $3p_{3/2}$=75.1 eV) and Au foils (Au $4f_{72}$=83.96 eV). † Peaks were charge referenced to $CH_x$ band in the carbon is spectra at 284.8 eV. Measurements were made at a takeoff angle of 450 with respect to the sample surface plane. This resulted in a typical sampling depth of 3-6 nm (95% of the signal originated from this depth or shallower). Quantification was done using instrumental relative sensitivity factors (RSFs) that account for the x-ray cross section and inelastic mean free path of the electrons. On homogeneous samples major elements (>5 atom %) tend to have standard deviations of <3% while minor elements can be significantly higher. The analysis size was ~200 μm in diameter. Ion sputtering was done using 2 kV Ar+ rastered over a 2 mm×2 mm area. The Al2O3 sputtering rate was 1.4 nm/minute based on the assumed thickness of 50 nm.

FIGS. 1A-1D demonstrate the XPS depth profiles for the different samples.

This study indicated that silicon becomes less visible as the thickness of the $Al_2O_3$ increased.

Example 2

This example demonstrates illustrative methods for developing a functional pH protective layer using atomic layer deposition (ALD) on a silicon wafer by determining the dissolution of the $Al_2O_3$ barrier layer at a pH of 3 and 9.

In this study, samples were placed in either a HCl pH 3 or a pH 9 phosphate buffer solution and incubated at 50° C. for 72 hours. The pH 3 or pH 9 buffer solution was collected after the 72 hours, and the concentration of aluminum was determined using inductively coupled plasma mass spectrometry (ICP-MS) or optical emission spectroscopy (OES). The samples that were analyzed consisted of: (i) a Si wafer with a 20 nm $Al_2O_3$ barrier layer, (ii) a Si wafer with a 50 nm $Al_2O_3$ barrier layer, (iii) a Si wafer with a 20 nm $Al_2O_3$ barrier layer and a 20 nm $ZrO_2$ pH protective layer deposited over the 20 nm $Al_2O_3$ barrier layer, and (iv) a Si wafer with a 50 nm $Al_2O_3$ barrier layer and a 50 nm $ZrO_2$ pH protective layer deposited over the 50 nm $Al_2O_3$ barrier layer.

Figure 3A:
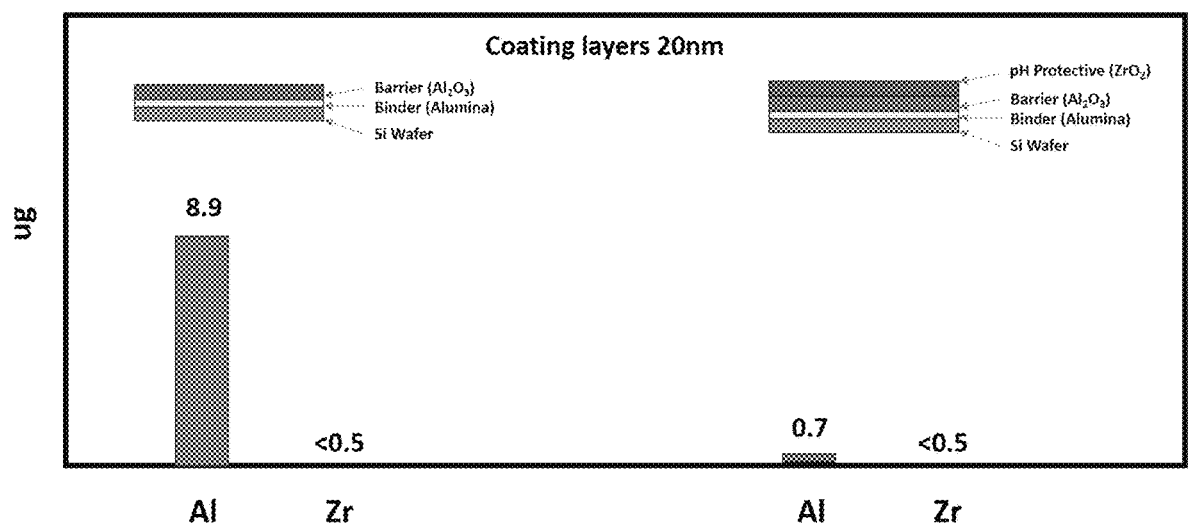
FIG. 3A is a schematic representation of the aluminum concentration in the collected pH 9 buffer solutions for a Si wafer coated with a 20 nm $Al_2O_3$ gas barrier layer and for a Si wafer with a 20 nm $Al_2O_3$ barrier layer and a 20 nm $ZrO_2$ pH protective layer deposited by ALD over the 20 nm $Al_2O_3$ barrier layer.
Figure 3B:
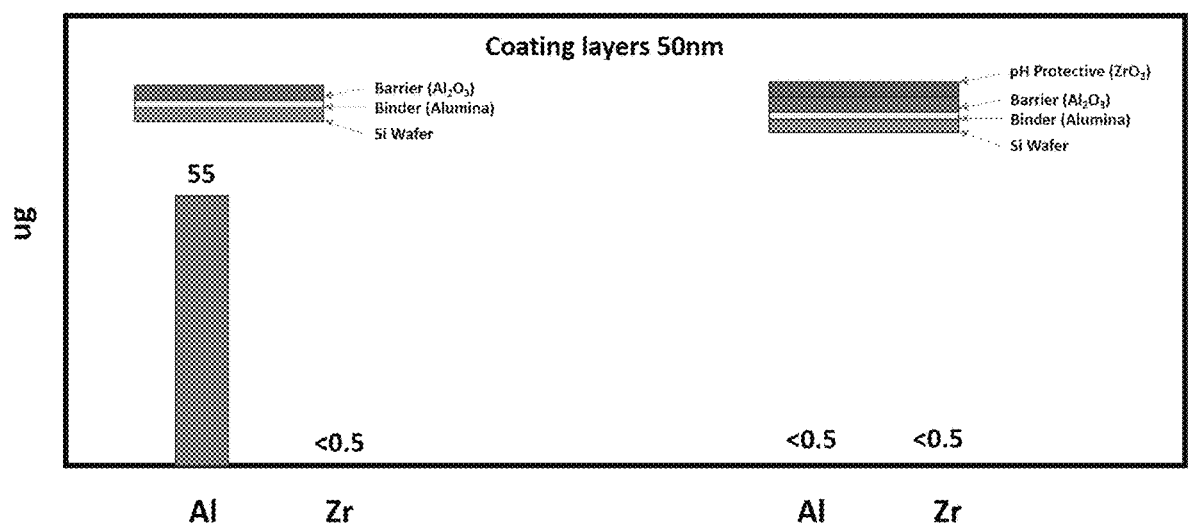
FIG. 3B is a schematic representation of the aluminum concentration in the collected pH 9 buffer solutions for a Si wafer coated with a 50 nm $Al_2O_3$ gas barrier layer and for a Si wafer with a 50 nm $Al_2O_3$ barrier layer and a 50 nm $ZrO_2$ pH protective layer deposited by ALD over the 50 nm $Al_2O_3$ barrier layer.
Figure 3C:
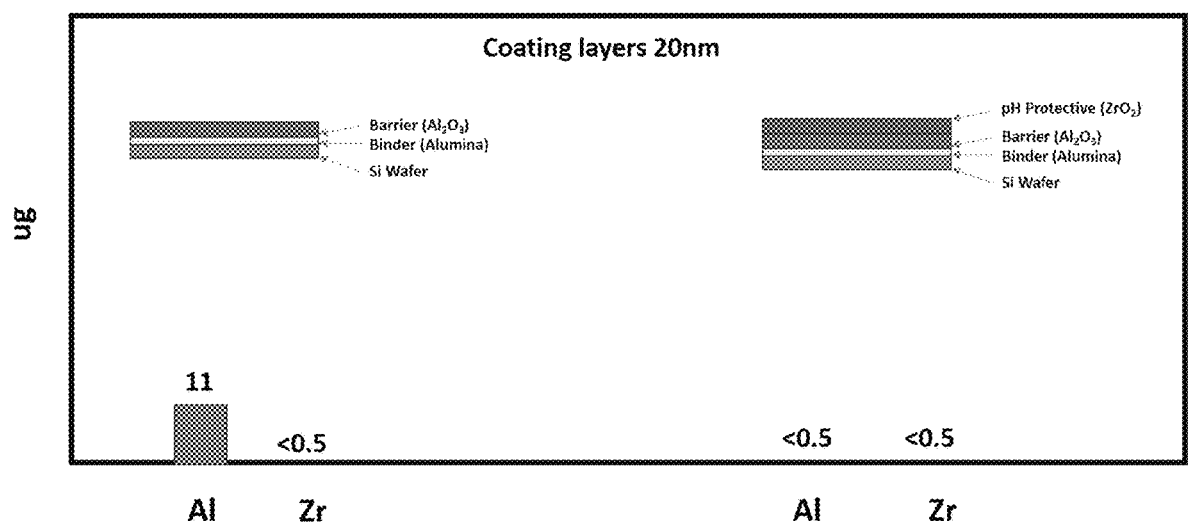
FIG. 3C is a schematic representation of the aluminum concentration in the collected pH 3 buffer solutions for a Si wafer coated with a 20 nm $Al_2O_3$ gas barrier layer and for a Si wafer with a 20 nm $Al_2O_3$ barrier layer and a 20 nm $ZrO_2$ pH protective layer deposited by ALD over the 20 nm $Al_2O_3$ barrier layer.
Figure 3D:
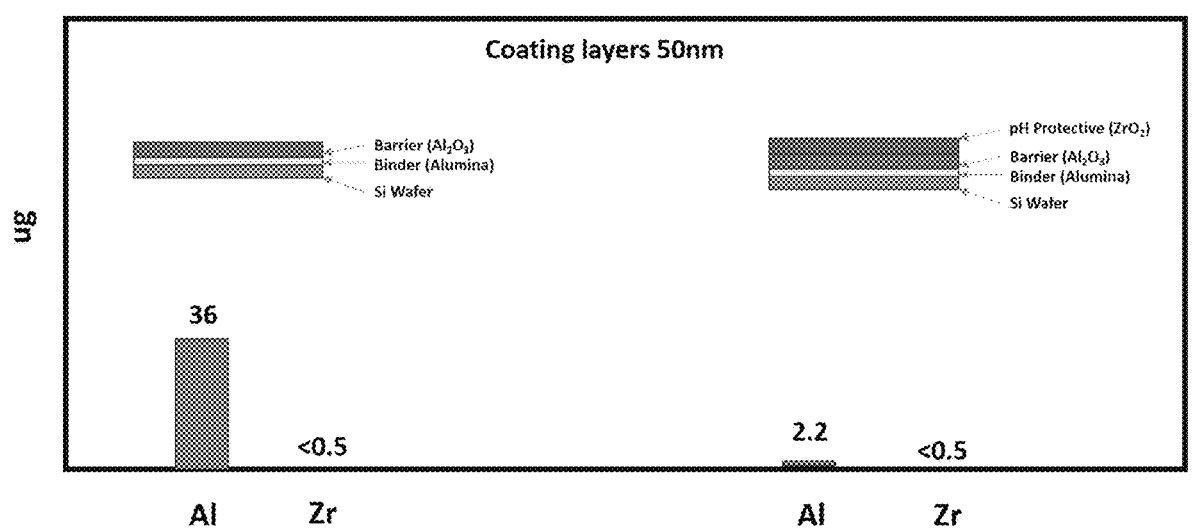
FIG. 3D is a schematic representation of the aluminum concentration in the collected pH 3 buffer solutions for a Si wafer coated with a 50 nm $Al_2O_3$ gas barrier layer and for a Si wafer with a 50 nm $Al_2O_3$ barrier layer and a 50 nm $ZrO_2$ pH protective layer deposited by ALD over the 50 nm $Al_2O_3$ barrier layer.
Figure 4A:
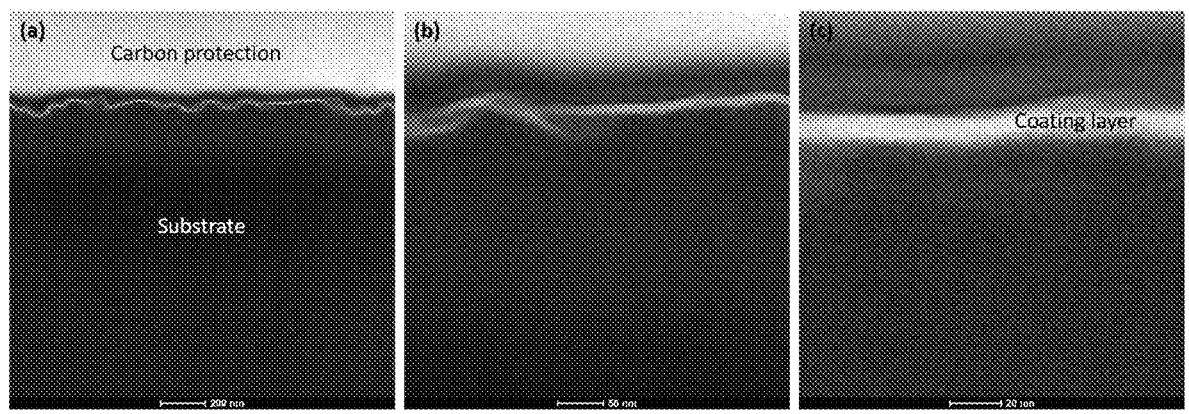
FIG. 4A is a schematic representation of the STEM surface images of the polypropylene substrate and coating layer at different magnifications (a) is at 200 nm, (b) is at 50 nm, and (c) is at 20 nm. The sample surface is rough and the thickness of the coating layer is about 10 nm to 15 nm.
Figure 4B:
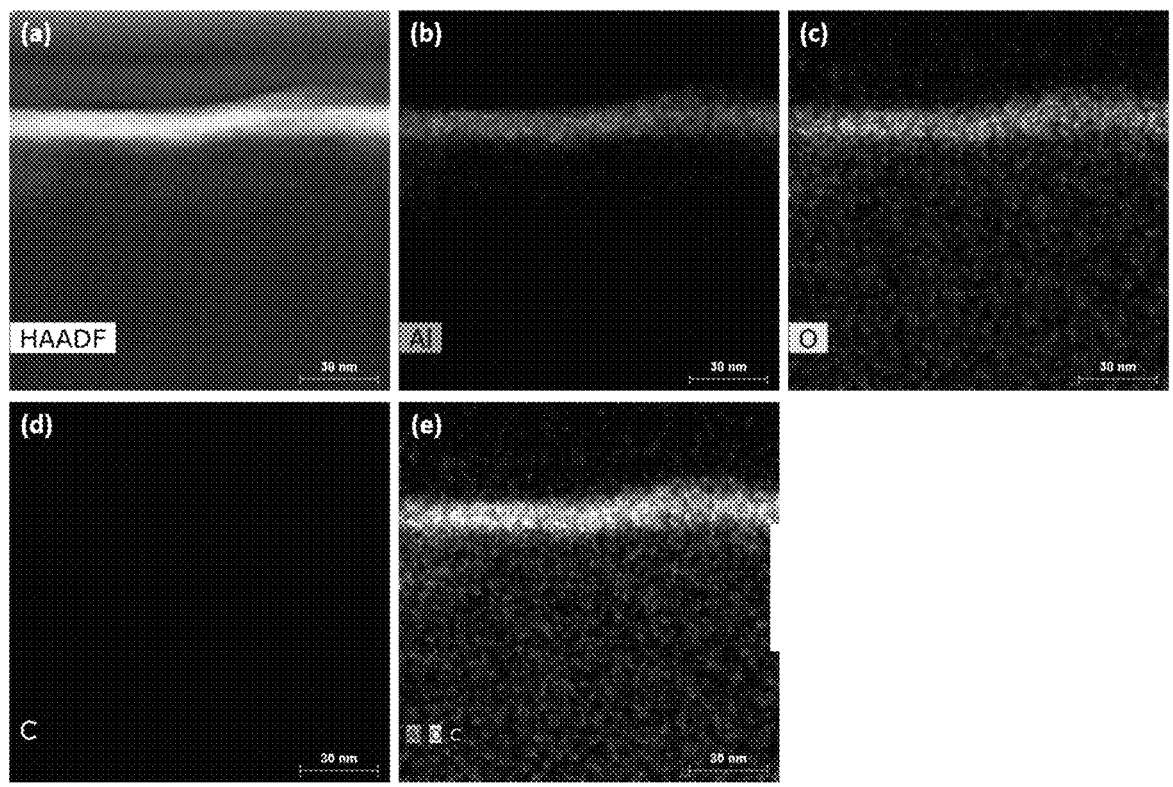
FIG. 4B is a schematic representation illustrating the energy dispersive spectrometry (EDS) mapping of the $Al_2O_3$ barrier layer on the polypropylene substrate at a magnification of 300 nm, (a) is a HAADF-STEM image, (b) is the line mapping of aluminum (Al), (c) is the line mapping of oxygen (O), (d) is the line mapping of carbon (C), and (e) is the line mapping of Al, O, and C combined.
Figure 4C:
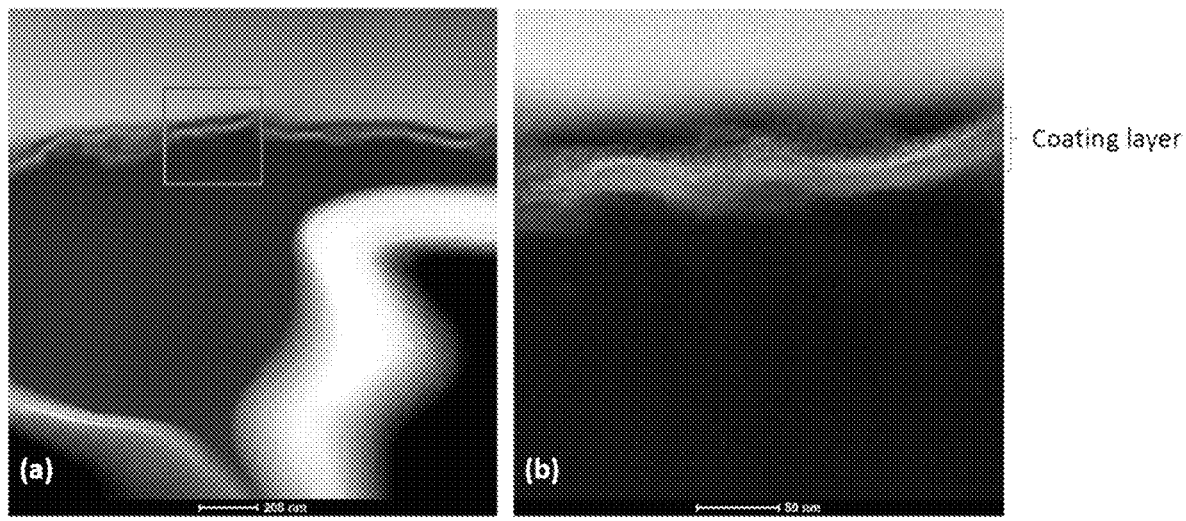
FIG. 4C is a schematic representation illustrating the $ZrO_2$ pH protective layer deposited over the $Al_2O_3$ on a polypropylene substrate using STEM at different magnifications, (a) is at 200 nm and (b) is at 50 nm. The thickness of the coating layer is about 25 to 35 nm.
Figure 4D:
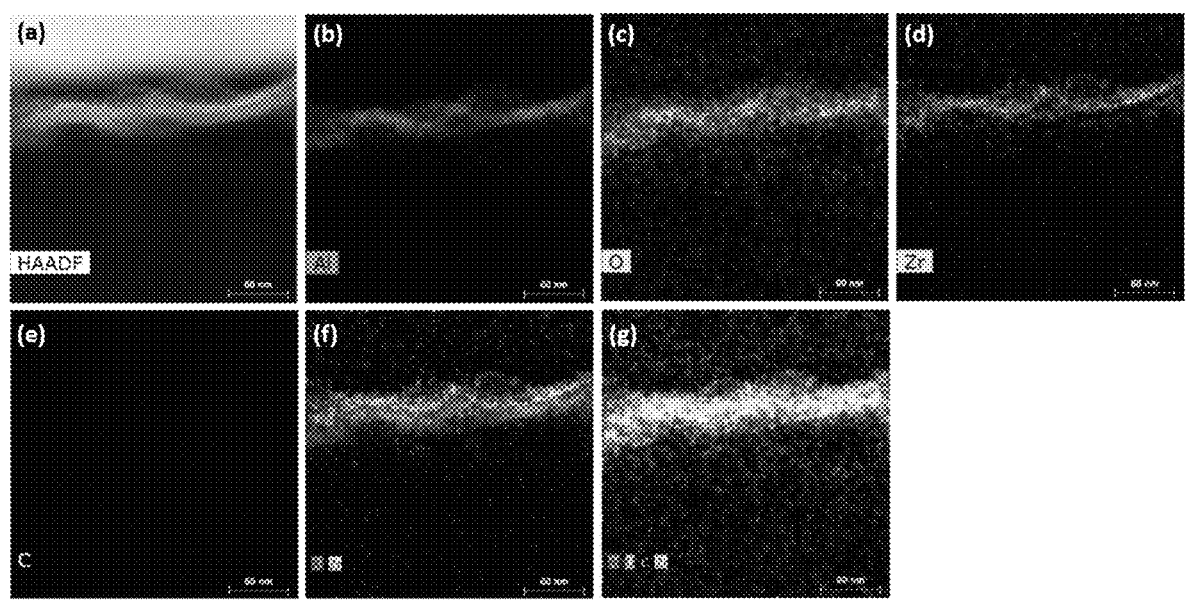
FIG. 4D is a schematic representation illustrating the energy dispersive spectrometry (EDS) mapping of the $ZrO_2$ pH protective layer deposited by ALD over the $Al_2O_3$ on the polypropylene substrate at a magnification of 60 nm, (a) is a HAADF-STEM image, (b) is the line mapping of aluminum (Al), (c) is the line mapping of oxygen (O), (d) is the line mapping of zirconium (Zr), (e) is the line mapping of carbon (C), (f) is the line mapping of Al and Zr combined, and (g) is the line mapping of Al, O, C, and Zr combined.

FIG. 3A is a schematic representation of the aluminum concentration in the collected pH 9 buffer solutions for a Si wafer coated with a 20 nm $Al_2O_3$ gas barrier layer and for a Si wafer with a 20 nm $Al_2O_3$ barrier layer and a 20 nm $ZrO_2$ pH protective layer deposited over the 20 nm $Al_2O_3$ barrier layer. FIG. 3B is a schematic representation of the aluminum concentration in the collected pH 9 buffer solutions for a Si wafer coated with a 50 nm $Al_2O_3$ gas barrier layer and for a Si wafer with a 50 nm $Al_2O_3$ barrier layer and a 50 nm $ZrO_2$ pH protective layer deposited over the 50 nm $Al_2O_3$ barrier layer. FIG. 3C is a schematic representation of the aluminum concentration in the collected pH 3 buffer solutions for a Si wafer coated with a 20 nm $Al_2O_3$ gas barrier layer and for a Si wafer with a 20 nm $Al_2O_3$ barrier layer and a 20 nm $ZrO_2$ pH protective layer deposited over the 20 nm $Al_2O_3$ barrier layer. FIG. 3D is a schematic representation of the aluminum concentration in the collected pH 3 buffer solutions for a Si wafer coated with a 50 nm $Al_2O_3$ gas barrier layer and for a Si wafer with a 50 nm $Al_2O_3$ barrier layer and a 50 nm $ZrO_2$ pH protective layer deposited over the 50 nm $Al_2O_3$ barrier layer.

This example provides illustrative methods for determining the dissolution at pH 3 or pH 9 of a coating system deposited on a silicon wafer. The data indicates that when the silicon wafer was only coated with either a 20 nm or 50 nm $Al_2O_3$ barrier layer, the concentration of aluminum in the pH 9 buffer solution was 8.9 µg and 55 µg, respectively. In contrast, when there is either a 20 nm or 50 nm $ZrO_2$ pH protective layer deposited over a 20 nm or 50 nm $Al_2O_3$ gas barrier layer, then the concentration of aluminum in the pH 9 buffer solution is 0.7 µg and <0.5 µg, respectively. Furthermore, the data indicates that when the silicon wafer is only coated with either a 20 nm or 50 nm $Al_2O_3$ barrier layer, the concentration of aluminum in the pH 3 buffer solution is 11 µg and 36 µg, respectively. In contrast, when there is either a 20 nm or 50 nm $ZrO_2$ pH protective layer deposited over a 20 nm or 50 nm $Al_2O_3$ gas barrier layer, then the concentration of aluminum in the pH 3 buffer solution was <0.5 µg and 2.2 µg, respectively.

Example 3

This example demonstrates illustrative methods for characterizing the gas barrier layer and pH protective layer that are deposited on a poly propylene substrate via atomic layer deposition using scanning transmission electron microscopy (STEM) and energy dispersive spectrometry (EDS).

In this study, samples were analyzed using STEM and EDS to characterize the gas barrier layer and pH protective layer. The poly propylene film samples used for this study had a length of 1.08 cm to 1.57 cm, a width of 0.88 cm to 1.25 cm, and an area of 0.95 $cm^2$ to 1.86 $cm^2$.

FIGS. 4A-4D are schematic representations of the gas barrier layer and/or pH protective layer on a poly propylene substrate.

This example demonstrates illustrative methods for characterizing the gas barrier layer and pH protective layer that are deposited on a poly propylene substrate via atomic layer deposition using scanning transmission electron microscopy (STEM). The data indicates that the $Al_2O_3$ gas barrier layer is about 10 nm to 15 nm thick, and the coating layer comprising the $Al_2O_3$ gas barrier layer and the $ZrO_2$ pH protective layer is 25 nm to 35 nm thick.

Example 4

This example demonstrates illustrative methods for developing a functional pH protective layer deposited via atomic layer deposition (ALD) on a polypropylene substrate by determining the dissolution of the $Al_2O_3$ barrier layer at pH 9.

In this study, samples were placed in a pH 9 phosphate buffer solution and incubated at 50° C. for 72 hours. The pH 9 buffer solution was collected and the concentration of aluminum was determined using inductively coupled plasma mass spectrometry (ICP-MS) or optical emission spectroscopy (OES). The polypropylene film samples used for this study had a length of 1.08 cm to 1.57 cm, a width of 0.88 cm to 1.25 cm, and an area of 0.95 $cm^2$ to 1.86 $cm^2$.

Figure 5:
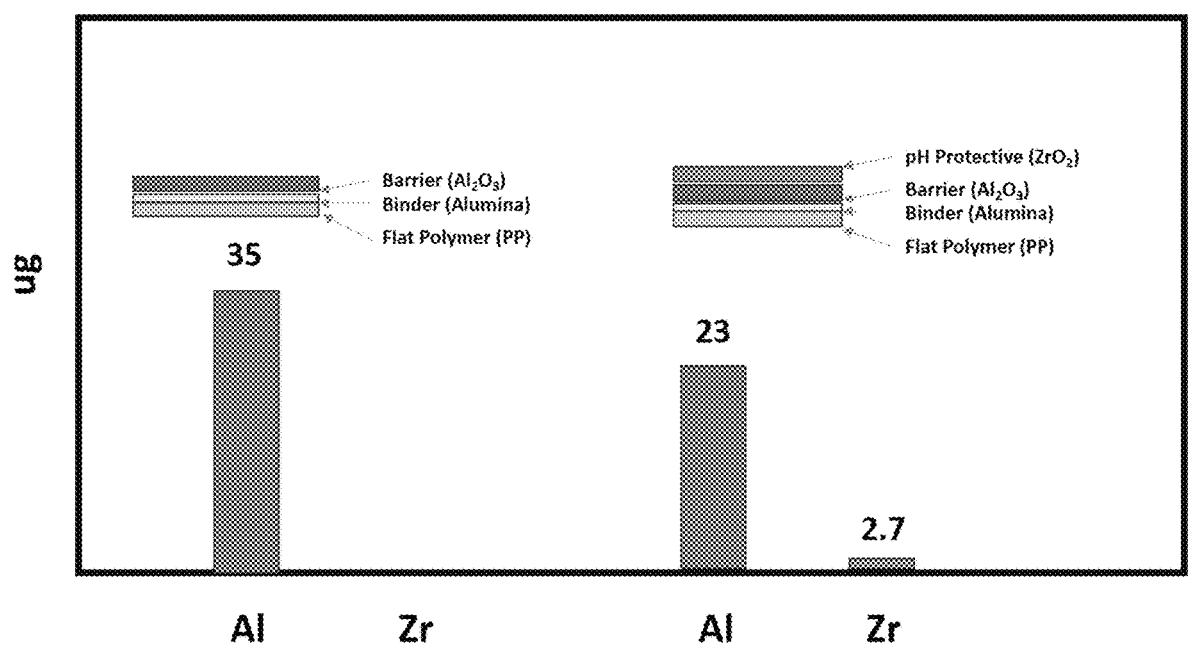
FIG. 5 is a schematic representation of the aluminum concentration in the collected pH 9 buffer solutions for the poly propylene sample coated with just an $Al_2O_3$ gas barrier layer and for the poly propylene sample coated with a $ZrO_2$ pH protective layer by ALD over the $Al_2O_3$ gas barrier.

FIG. 5 is a schematic representation of the aluminum concentration in the collected pH 9 buffer solutions for the sample coated with just an $Al_2O_3$ gas barrier layer and for the sample coated with a $ZrO_2$ pH protective layer over the $Al_2O_3$ gas barrier.

This example provides illustrative methods for determining the dissolution at pH 9 of a coating system deposited on a poly propylene substrate. The data indicates that when there is no pH protective layer present, the concentration of aluminum in the pH 9 buffer solution is 35 µg. In contrast, when there is a $ZrO_2$ pH protective layer deposited over the $Al_2O_3$ gas barrier layer, then the concentration of aluminum in the pH 9 buffer solution is 23 µg.

Example 5

This example demonstrates the differences in depositing a pH protective layer with atomic layer deposition (ALD) versus plasma-enhanced chemical vapor deposition (PECVD).

In this study, a pH protective layer was deposited over a gas barrier layer, and the thicknesses of the pH protective layers were determined for both application methods. For the ALD system, the pH protective layer was found to be 20 nm to 50 nm thick, while for the PECVD system, the pH protective layer was found to be 250 nm to 400 nm thick.

Figure 6:
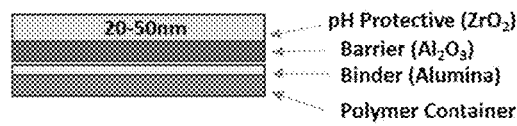
FIG. 6 is a schematic representation illustrating the thickness differences in depositing a pH protective layer with atomic layer deposition (ALD) versus plasma-enhanced chemical vapor deposition (PECVD).
Figure 6:
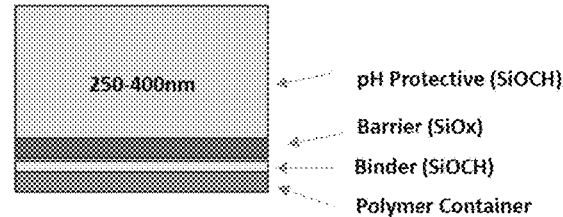

FIG. 6 is a schematic representation illustrating the differences in depositing a pH protective layer with atomic layer deposition (ALD) versus plasma-enhanced chemical vapor deposition (PECVD).

This example demonstrates the differences in depositing a pH protective layer with either ALD or PECVD. The data indicates that a $ZrO_2$ pH protective layer deposited using ALD is approximately 10 times thinner than when applied with PECVD, with no change in functionality. The advantage of a thinner coating is that it provides a more robust polymer pharmaceutical container that can withstand thermal cycling and mechanical deflection of the container without risk of the pH protective coating cracking or becoming damaged.

All references, including publications, patent applications, and patents, cited herein are hereby incorporated by reference to the same extent as if each reference were individually and specifically indicated to be incorporated by reference and were set forth in its entirety herein.

The use of the terms "a" and "an" and "the" and "at least one" and similar referents in the context of describing the invention (especially in the context of the following claims) are to be construed to cover both the singular and the plural, unless otherwise indicated herein or clearly contradicted by context. The use of the term "at least one" followed by a list of one or more items (for example, "at least one of A and B") is to be construed to mean one item selected from the listed items (A or B) or any combination of two or more of the listed items (A and B), unless otherwise indicated herein or clearly contradicted by context. The terms "comprising," "having," "including," and "containing" are to be construed as open-ended terms (i.e., meaning "including, but not limited to,") unless otherwise noted. Recitation of ranges of values herein are merely intended to serve as a shorthand method of referring individually to each separate value falling within the range, unless otherwise indicated herein, and each separate value is incorporated into the specification as if it were individually recited herein. All methods described herein can be performed in any suitable order unless otherwise indicated herein or otherwise clearly contradicted by context. The use of any and all examples, or exemplary language (e.g., "such as") provided herein, is intended merely to better illuminate the invention and does not pose a limitation on the scope of the invention unless otherwise claimed. No language in the specification should be construed as indicating any non-claimed element as essential to the practice of the invention.

Preferred aspects of this invention are described herein, including the best mode known to the inventors for carrying out the invention. Variations of those preferred aspects may become apparent to those of ordinary skill in the art upon reading the foregoing description. The inventors expect skilled artisans to employ such variations as appropriate, and the inventors intend for the invention to be practiced otherwise than as specifically described herein. Accordingly, this invention includes all modifications and equivalents of the subject matter recited in the claims appended hereto as permitted by applicable law. Moreover, any combination of the above-described elements in all possible variations thereof is encompassed by the invention unless otherwise indicated herein or otherwise clearly contradicted by context.

The invention claimed is:

1. A pharmaceutical container comprising a lumen defined in part by a wall made of a polymer,
the wall having an inner surface facing the lumen, an outer surface, and a pH protective layer comprising $TiO_2$, $ZrO_2$, and/or $MgO$ disposed on the inner surface,
wherein the pH protective layer is a layer produced by atomic layer deposition (ALD) process.

2. The pharmaceutical container of claim 1, wherein the pH protective layer comprises $TiO_2$ deposited by an ALD process by utilizing tetrakis(dimethylamino) titanium (TDMAT), tetrakis(diethylamino) titanium (TDEAT), or tetrakis(ethylmethylamino) titanium (TEMAT) or a combination thereof, as a reactant or reactants.

3. The pharmaceutical container of claim 1, wherein the pH protective layer comprises $ZrO_2$ deposited by an ALD process by utilizing tetrakisdimethylamidozirconium (Zr(NMe$_2$)$_4$), tetrakisethylmethylamidozirconium Zr(NMeEt)$_4$, or tetrakisdiethylamidozirconium Zr(NEt$_2$)$_4$, or a combination thereof, as a reactant or reactants.

4. The pharmaceutical container of claim 1, wherein the pH protective layer comprises MgO and is deposited by an ALD process by utilizing Mg(thd)$_2$ (2,2,6,6-tetramethyl-3,5-heptanedionate magnesium), Mg(Cp)$_2$ (bis(cyclopentadienyl)magnesium), or Mg(EtCp)$_2$ (bis(ethylcyclopentadienyl)magnesium), or a combination thereof, as a reactant or reactants.

5. The pharmaceutical container of claim 1, further comprising a gas barrier layer disposed between the inner surface and the pH protective layer.

6. The pharmaceutical container of claim 5, wherein the gas barrier layer comprises $Al_2O_3$ and/or $Al_3O_5$.

7. The pharmaceutical container of claim 5, wherein the pH protective layer and/or the gas barrier layer are applied by ALD at a temperature that is less than the Tg of the polymer of the polymer wall.

8. The pharmaceutical container of claim 7, wherein the pH protective layer and/or the gas barrier layer is/are applied by ALD at a temperature of 100° C. or less.

9. The pharmaceutical container of claim 7, wherein the pH protective layer and/or the gas barrier layer is/are applied by ALD at a temperature of 110° C. or less.

10. The pharmaceutical container of claim 7, wherein the pH protective layer and/or the gas barrier layer is/are applied by ALD at a temperature of 120° C. or less.

11. The pharmaceutical container of claim 7, wherein the pH protective layer and/or the gas barrier layer is/are applied by ALD at a temperature of 130° C. or less.

12. The pharmaceutical container of claim 7, wherein the pH protective layer and/or the gas barrier layer is/are applied by ALD at a temperature of 140° C. or less.

13. The pharmaceutical container of claim 7, wherein the pH protective layer and/or the gas barrier layer is/are applied by ALD at a temperature of 150° C. or less.

14. The pharmaceutical container of claim 1, wherein the polymer of the pharmaceutical container is selected from the group consisting of polypropylene, cyclo olefin polymer (COP), cyclo olefin co-polymer (COC), polyethylene, polyethylene terephthalate, and a combination thereof.

15. The pharmaceutical container of claim 14, wherein the polymer is a COP, COC, or a combination thereof.

16. The pharmaceutical container of claim 15, wherein the COP or COC is a polymer made from at least one cyclic olefin selected from the group consisting of cyclobutene, cyclopentene, cyclooctene, norbornene, 5-methylnorbornene, 3-methylnorbornene, ethylnorbornene, phenylnorbornene, dimethylnorbornene, diethylnorbornene, dicyclopentadiene, tetracycloclododecene, and methyltetracyclododecane.

17. The pharmaceutical container of claim 15, wherein the COP or COC is a polymer made from at least one cyclic olefin selected from the group consisting of norbornene, 6-methylnorbornene, 6-ethylnorbornene, 6-n-butylnorbornene, 5-propylnorbornene, 1-methylnorbornene, 7-methylnorbornene, 5,6-di-methylnorbornene, 5-phenylnorbornene, 5-benzylic norbornene, 8-methyltetracyclo-3-dodecene, 8-ethyltetracyclo-3-dodecene, 8-hexyltetracyclo-3-dodecene, 2,10-dimethyltetracyclo-3-dodecene, and 5,10-dimethyltetracyclo-3-dodecene.

18. The pharmaceutical container of claim 5, wherein the gas barrier layer provides a barrier against carbon dioxide, nitrogen, oxygen, and/or water vapor.

19. The pharmaceutical container of claim 5, wherein the gas barrier layer has a thickness of 50 nm or less.

20. The pharmaceutical container of claim 1, wherein the pH protective layer has a thickness of 50 nm or less.

21. The pharmaceutical container of claim 19, wherein a thickness of the gas barrier layer is measured by TEM or XPS.

22. The pharmaceutical container of claim 20, wherein a thickness of the pH protective layer is measured by TEM or XPS.

23. The pharmaceutical container of claim 15, wherein the pH protective layer reduces the rate of dissolution of the gas barrier layer by >90% when exposed to a pH of 3 to 9 at a temperature of 50° C. for 72 hours.

24. The pharmaceutical container of claim 1, further comprising a binding layer deposited on the lumen.

25. The pharmaceutical container of claim 24, wherein the binding layer comprises alumina.

26. The pharmaceutical container of claim 1, which further contains a pharmaceutical composition.

27. The pharmaceutical container of claim 26, wherein the pharmaceutical composition has a pH of from 3 to 12.

28. The pharmaceutical container of claim 27, wherein the pharmaceutical composition has a pH of from 3 to 9 or from 6 to 9.

29. The pharmaceutical container of claim 26, wherein the pharmaceutical composition comprises a peptide, a protein, a monoclonal antibody, or a constituent of blood.

30. The pharmaceutical container of claim 26, wherein the pharmaceutical composition comprises a biologic drug selected from abatacept; abciximab; abobotulinumtoxinA; adalimumab; adalimumab-adaz; adalimumab-adbm; adalimumab-afzb; adalimumab-atto; adalimumab-bwwd; adotrastuzumab emtansine; aflibercept; agalsidase beta; albiglutide; albumin chromated CR-51 serum; aldesleukin; alefacept; alemtuzumab; alglucosidase alfa; alirocumab; alteplase; anakinra; aprotinin; asfotas alfa; asparaginase; asparaginase *Erwinia chrysanthemi*; atezolizumab; avelumab; basiliximab; becaplermin; belatacept; belimumab; benralizumab; beractant; bevacizumab; bevacizumab-awwb; bevacizumab-bvzr; bezlotoxumab; blinatumomab; brentuximab vedotin; brodalumab; brolucizumab-dbll;

burosumab-twza; calaspargase pegol-mknl; calfactant; canakinumab; caplacizumab-yhdp; capromab pendetide; cemiplimab-rwlc; cenegermin-bkjc; cerliponase alfa; certolizumab pegol; cetuximab; choriogonadotropin alfa; chorionic gonadotropin; chymopapain; collagenase; collagenase *Clostridium histolyticum*; corticorelin ovine triflutate; crizanlizumab-tmca; daclizumab; daratumumab; daratumumab and hyaluronidase-fihj; darbepoetin alpha; denileukin diftitox; denosumab; desirudin; dinutuximab; dornase alfa; drotrecogin alfa; dulaglutide; dupilumab; durvalumab; ecallantide; eculizumab; efalizumab; elapegademase-lvlr; elosulfase alfa; elotuzumab; emapalumab-lzsg; emicizumab-kxwh; enfortumab vedotin-ejfv; epoetin alfa; epoetin alfa-epbx; erenumab-aooe; etanercept; etanercept-szzs; etanercept-ykro; evolocumab; fam-trastuzumab deruxetecan-nxki; fibrinolysin and desoxyribonuclease combined [bovine], with chloramphenicol; filgrastim; filgrastim-aafi; filgrastim-sndz; follitropin alfa; follitropin beta; fremanezumab-vfrm; galcanezumab-gnlm; galsulfase; gemtuzumab ozogamicin; glucarpidase; golimumab; guselkumab; hyaluronidase; hyaluronidase human; ibalizumab-uiyk; ibritumomab tiuxetan; idarucizumab; idursulfase; imiglucerase; incobotulinumtoxinA; inebilizumab-cdon; infliximab; infliximab-abda; infliximab-axxq; infliximab-dyyb; infliximab-qbtx; inotuzumab ozogamicin; insulin aspart; insulin aspart protamine and insulin aspart; insulin degludec; insulin degludec and insulin aspart; insulin degludec and liraglutide; insulin detemir; insulin glargine; insulin glargine and lixisenatide; insulin glulisine; insulin human; insulin isophane human; insulin isophane human and insulin human; insulin lispro; insulin lispro protamine and insulin lispro; insulin lispro-aabc; interferon alfa-2a; interferon alfa-2b; interferon alfacon-1; interferon alfa-n3 (human leukocyte derived); interferon beta-1 a; interferon beta-1 b; interferon gamma-1 b; ipilimumab; isatuximab-irfc; ixekizumab; lanadelumab-flyo; laronidase; lixisenatide; luspatercept-aamt; mecasermin; mecasermin rinfabate; menotropins; mepolizumab; methoxy polyethylene glycol-epoetin beta; metreleptin; mogamulizumab-kpkc; moxetumomab pasudotox-tdfk; muromanab-CD3; natalizumab; necitumumab; nivolumab; nofetumomab; obiltoxaximab; obinutuzumab; ocrelizumab; ocriplasmin; ofatumumab; olaratumab; omalizumab; onabotulinumtoxinA; oprelvekin; palifermin; palivizumab; pancrelipase; panitumumab; parathyroid hormone; pegademase bovine; pegaspargase; pegfilgrastim; pegfilgrastim-apgf; pegfilgrastim-bmez; pegfilgrastim-cbqv; pegfilgrastim-jmdb; peginterferon alfa-2a; peginterferon alfa-2a and ribavirin; peginterferon alfa-2b; peginterferon alfa-2b and ribavirin; peginterferon beta-1 a; pegloticase; pegvaliase-pqpz; pegvisomant; pembrolizumab; pertuzumab; polatuzumab vedotin-piiq; poractant alfa; prabotulinumtoxinA-xvfs; radiolabeled albumin technetium Tc-99m albumin colloid kit; ramucirumab; ranibizumab; rasburicase; ravulizumab-cwvz; raxibacumab; reslizumab; reteplase; rilonacept; rimabotulinumtoxinB; risankizumab-rzaa; rituximab; rituximab and hyaluronidase human; rituximab-abbs; rituximab-pvvr; romiplostim; romosozumab-aqqg; sacituzumab govitecan-hziy; sacrosidase; sargramostim; sarilumab; sebelipase alfa; secukinumab; siltuximab; somatropin; tagraxofusp-erzs; taliglucerase alfa; tbo-filgrastim; technetium 99m tc fanolesomab; tenecteplase; teprotumumab-trbw; tesamorelin acetate; thyrotropin alfa; tildrakizumab-asmn; tocilizumab; tositumomab and iodine 1-131 tositumomab; trastuzumab; trastuzumab and hyaluronidase-oysk; trastuzumab-anns; trastuzumab-dkst; trastuzumab-dttb; trastuzumab-pkrb; trastuzumab-qyyp; urofollitropin; urokinase; ustekinumab; vedolizumab; velaglucerase alfa; vestronidase alfa-vjbk; Ziv-Aflibercept; Amjevita (adalimumab-atto); Dupixent (dupilumab); Fulphila (pegfilgrastim-jmdb); Ilaris (canakinumab); Ixifi (infliximab-qbtx); Lyumjev (insulin lispro-aabc); Nyvepria (pegfilgrastim-apgf); Ogivri (trastuzumab-dkst); Semglee (insulin glargine); Uplizna (inebilizumab-cdon); A.P.L. (chorionic gonadotropin); Abrilada (adalimumab-afzb); Aduhelm (aducanumab-avwa); Accretropin (somatropin); Actemra (tocilizumab); Acthrel (corticorelin ovine triflutate); Actimmune (interferon gamma-1 b); Activase (alteplase); Adagen (pegademase bovine); Adakveo (crizanlizumab-tmca); Adbry (tralokinumab-ldrm); Adcetris (brentuximab vedotin); Adlyxin (lixisenatide); Admelog (insulin lispro); Afrezza (insulin human); Aimovig (erenumab-aooe); Ajovy (fremanezumab-vfrm); Aldurazyme (laronidase); Alferon N Injection (interferon alfa-n3 (human leukocyte derived)); Amevive (alefacept); Amphadase (hyaluronidase); Anthim (obiltoxaximab); Apidra (insulin glulisine); Aranesp (darbepoetin alpha); Arcalyst (rilonacept); Arzerra (ofatumumab); Asparlas (calaspargase pegol-mknl); Avastin (bevacizumab); Avonex (interferon beta-1 a); Avsola (infliximab-axxq); Basaglar (insulin glargine); Bavencio (avelumab); Benlysta (belimumab); Beovu (brolucizumab-dbll); Besponsa (inotuzumab ozogamicin); Besremi (ropeginterferon-alfa-2b-njft); Betaseron (interferon beta-1 b); Bexxar (tositumomab and iodine 1-131 tositumomab); Beyfortus (nirsevimab-alip); Bimzelx (bimekizumab); Blincyto (blinatumomab); Botox (onabotulinumtoxinA); Botox Cosmetic (onabotulinumtoxinA); Bravelle (urofollitropin); Brineura (cerliponase alfa); Briumvi (ublituximab-xiiy); Cablivi (caplacizumab-yhdp); Campath (alemtuzumab); Cathflo Activase (alteplase); Cerezyme (imiglucerase); Chorionic Gonadotropin (chorionic gonadotropin); Chromalbin (albumin chromated CR-51 serum); Chymodiactin (chymopapain); Cimzia (certolizumab pegol); Cinqair (reslizumab); Columvi (glofitamab-gxbm); Cosentyx (secukinumab); Cotazym (pancrelipase); Creon (pancrelipase); Crysvita (burosumab-twza); Curosurf (poractant alfa); Cyltezo (adalimumab-adbm); Cyramza (ramucirumab); Darzalex (daratumumab); Darzalex Faspro (daratumumab and hyaluronidase-fihj); Daxxify (daxibotulinumtoixna-lanm); Draximage MAA (kit for the preparation of technetium Tc-99m albumin aggregated); Dysport (abobotulinumtoxinA); Egrifta (tesamorelin acetate); Egrifta SV (tesamorelin acetate); Elahere (mirvetuximab soravtansine-gynx); Elaprase (idursulfase); Elase-chloromycetin (fibrinolysin and desoxyribonuclease combined [bovine], with chloramphenicol); Elelyso (taliglucerase alfa); Elfabrio (pegunigalsidase alfa-iwxj); Elitek (rasburicase); Elrexfio (elranatamab-bcmm); Elspar (asparaginase); Elzonris (tagraxofusp-erzs); Emgality (galcanezumab-gnlm); Empliciti (elotuzumab); Enbrel (etanercept); Enbrel Mini (etanercept); Enhertu (fam-trastuzumab deruxetecan-nxki); Enjaymo (sutimlimab-jome); Entyvio (vedolizumab); Epkinly (epcoritamab-bysp); Epogen/Procrit (epoetin alfa); Erbitux (cetuximab); Erelzi (etanercept-szzs); Erelzi Sensoready (etanercept-szzs); Erwinaze (asparaginase *Erwinia chrysanthemi*); Eticovo (etanercept-ykro); Evenity (romosozumab-aqqg); Evkeeza (evinacumab-dgnb), Extavia (interferon beta-1 b); Eylea (aflibercept); Fabrazyme (agalsidase beta); Fasenra (benralizumab); Fiasp (insulin aspart); Follistim (follitropin beta); Follistim AQ (follitropin beta); Follistim AQ Cartridge (follitropin beta); Gamifant (emapalumab-lzsg); Gazyva (obinutuzumab); Genotropin (somatropin); Gonal-f (follitropin alfa); Gonal-f RFF (follitropin alfa); Gonal-f RFF RediJect (follitropin alfa); Granix (tbo-filgrastim); Hadlima (adalimumab-bwwd);

Hemlibra (emicizumab-kxwh); Herceptin (trastuzumab); Herceptin Hylecta (trastuzumab and hyaluronidase-oysk); Herzuma (trastuzumab-pkrb); Humalog (insulin lispro); Humalog Mix 50/50 (insulin lispro protamine and insulin lispro); Humalog Mix 75/25 (insulin lispro protamine and insulin lispro); Humatrope (somatropin); Humegon (menotropins); Humira (adalimumab); Humulin 70/30 (insulin isophane human and insulin human); Humulin N (insulin isophane human); Humulin R U-100 (insulin human); Humulin R U-500 (insulin human); Hydase (hyaluronidase); Hylenex recombinant (hyaluronidase human); Hyrimoz (adalimumab-adaz); Ilumya (tildrakizumab-asmn); Imfinzi (durvalumab); Imjudo (tremelimumab-actl); Increlex (mecasermin); Infasurf (calfactant); Infergen (interferon alfacon-1); Inflectra (infliximab-dyyb); Intron A (interferon alfa-2b); Iplex (mecasermin rinfabate); Iprivask (desirudin); Jeanatope (kit for iodinated 1-125 albumin); Jemperli (dostarlimab-gxly); Jetrea (ocriplasmin); Jeuveau (prabotulinumtoxinA-xvfs); Kadcyla (ado-trastuzumab emtansine); Kalbitor (ecallantide); Kanjinti (trastuzumab-anns); Kanuma (sebelipase alfa); Kepivance (palifermin); Kevzara (sarilumab); Keytruda (pembrolizumab); Kimmtrak (tebentafusp-tebn); Kineret (anakinra); Kinlytic (urokinase); Krystexxa (pegloticase); Lamzede (velmanase alfa-tycv); Lantus (insulin glargine); Lartruvo (olaratumab); Lemtrada (alemtuzumab); Leqembi (lecanemab-irmb); Leukine (sargramostim); Levemir (insulin detemir); Libtayo (cemiplimab-rwlc); Loqtorzi (toripalimab-tpzi); Lucentis (ranibizumab); Lumizyme (alglucosidase alfa); Lumoxiti (moxetumomab pasudotox-tdfk); Lunsumio (mosunetuzumab-axgb); Macrotec (kit for the preparation of technetium Tc-99m albumin aggregated); Megatope (kit for iodinated 1-131 albumin); Menopur (menotropins); Mepsevii (vestronidase alfa-vjbk); Microlite (radiolabeled albumin technetium Tc-99m albumin colloid kit); Mircera (methoxy polyethylene glycol-epoetin beta); Mvasi (bevacizumab-awwb); Myalept (metreleptin); Mylotarg (gemtuzumab ozogamicin); Myobloc (rimabotulinumtoxinB); Myozyme (alglucosidase alfa); Myxredlin (insulin human); N/A (raxibacumab); Naglazyme (galsulfase); Natpara (parathyroid hormone); Neulasta (pegfilgrastim); Neulasta Onpro (pegfilgrastim); Neumega (oprelvekin); Neupogen (filgrastim); NeutroSpec (technetium 99m tc fanolesomab); Nexobrid (anacaulase-bcdb); Nexviazyme (avalglucosidase alfa-ngpt); Ngenla (somatrogon-ghla); Nivestym (filgrastim-aafi); Norditropin (somatropin); Novarel (chorionic gonadotropin); Novolin 70/30 (insulin isophane human and insulin human); Novolin N (insulin isophane human); Novolin R (insulin human); Novolog (insulin aspart); Novolog Mix 50/50 (insulin aspart protamine and insulin aspart); Novolog Mix 70/30 (insulin aspart protamine and insulin aspart); Nplate (romiplostim); Nucala (mepolizumab); Nulojix (belatacept); Nutropin (somatropin); Nutropin AQ (somatropin); Ocrevus (ocrelizumab); Omnitrope (somatropin); Omvoh (mirikizumab-mrkz); Oncaspar (pegaspargase); Ontak (denileukin diftitox); Ontruzant (trastuzumab-dttb); Opdivo (nivolumab); Opdualag (nivolumab and relatlimab-rmbw); Orencia (abatacept); Orthoclone OKT3 (muromanab-CD3); Ovidrel (choriogonadotropin alfa); Oxervate (cenegermin-bkbj); Padcev (enfortumab vedotin-ejfv); Palynziq (pegvaliase-pqpz); Pancreaze (pancrelipase); Pegasys (peginterferon alfa-2a); Pegasys Copegus Combination Pack (peginterferon alfa-2a and ribavirin); Pegintron (peginterferon alfa-2b); Peglntron/Rebetol Combo Pack (peginterferon alfa-2b and ribavirin); Pergonal (menotropins); Perjeta (pertuzumab); Pertzye (pancrelipase); Plegridy (peginterferon beta-1 a); Polivy (polatuzumab vedotin-piiq); Pombiliti (cipaglucosidase alfa-atga); Portrazza (necitumumab); Poteligeo (mogamulizumab-kpkc); Praluent (alirocumab); Praxbind (idarucizumab); Pregnyl (chorionic gonadotropin); Procrit (epoetin alfa); Proleukin (aldesleukin); Prolia (denosumab); ProstaScint (capromab pendetide); Pulmolite (kit for the preparation of technetium Tc-99m albumin aggregated); Pulmotech MAA (kit for the preparation of technetium Tc-99m albumin aggregated); Pulmozyme (dornase alfa); Raptiva (efalizumab); Rebif (interferon beta-1 a); Reblozyl (luspatercept-aamt); Regranex (becaplermin); Remicade (infliximab); Renflexis (infliximab-abda); Reopro (abciximab); Repatha (evolocumab); Repronex (menotropins); Retacrit (epoetin alfa-epbx); Retavase (reteplase); Revcovi (elapegademase-lvlr); Rituxan (rituximab); Rituxan Hycela (rituximab and hyaluronidase human); Roferon-A (interferon alfa-2a); Rolvedon (eflapegrastim-xnst); Ruxience (rituximab-pvvr); Rybrevant (amivantamab-vmjw); Rylaze (asparaginase *Erwinia chrysanthemi* (recombinant)-rywn); Ryzneuta; Rystiggo (rozanolixizumab-noli); Ryzodeg 70/30 (insulin degludec and insulin aspart); Saizen (somatropin); Santyl (collagenase); Saphnelo (anifrolumab-fnia); Sarclisa (isatuximab-irfc); Serostim (somatropin); Siliq (brodalumab); Simponi (golimumab); Simponi Aria (golimumab); Simulect (basiliximab); Skyrizi (risankizumab-rzaa); Skytrofa (lonapegsomatropin-tcgd); Soliqua 100/33 (insulin glargine and lixisenatide); Soliris (eculizumab); Somavert (pegvisomant); Spevigo (spesolimab-sbzo); Stelara (ustekinumab); Strensiq (asfotas alfa); Sucraid (sacrosidase); Survanta (beractant); Susvimo (ranibizumab); Sylvant (siltuximab); Synagis (palivizumab); Takhzyro (lanadelumab-flyo); Taltz (ixekizumab); Talvey (talquetamab-tgvs); Tanzeum (albiglutide); Tecentriq (atezolizumab); Tecvayli (teclistamab-cqyv); Tepezza (teprotumumab-trbw); Tezspire (tezepelumab-ekko); Thyrogen (thyrotropin alfa); Tivdak (tisotumab vedotin-tftv); TNKase (tenecteplase); Toujeo (insulin glargine); Trasylol (aprotinin); Trazimera (trastuzumab-qyyp); Tremfya (guselkumab); Tresiba (insulin degludec); Trodelvy (sacituzumab govitecan-hziy); Trogarzo (ibalizumab-uiyk); Trulicity (dulaglutide); Truxima (rituximab-abbs); Tysabri (natalizumab); Tzield (teplizumab-mzwv); Udenyca (pegfilgrastim-cbqv); Ultomiris (ravulizumab-cwvz); Unituxin (dinutuximab); Vabysmo (faricimab-svoa); Vectibix (panitumumab); Veopoz (pozeilimab-bbfg); Verluma (nofetumomab); Vimizim (elosulfase alfa); Viokace (pancrelipase); Vitrase (hyaluronidase); Voraxaze (glucarpidase); VPRIV (velaglucerase alfa); Vyvgart (efgartigimod alfa-fcab); Vyvgart Hytrulo (efgartigimod alfa and hyaluronidase-qvfc); Xenpozyme (olipudase alfa-rpcp); Xeomin (incobotulinumtoxinA); Xgeva (denosumab); Xiaflex (collagenase *Clostridium histolyticum*); Xigris (drotrecogin alfa); Xolair (omalizumab); Xultophy 100/3.6 (insulin degludec and liraglutide); Yervoy (ipilimumab); Zaltrap (Ziv-Aflibercept); Zarxio (filgrastim-sndz); Zenapax (daclizumab); Zenpep (pancrelipase); Zevalin (ibritumomab tiuxetan); Ziextenzo (pegfilgrastim-bmez); Zinbryta (daclizumab); Zinplava (bezlotoxumab); Zirabev (bevacizumab-bvzr); Zomacton (somatropin); Zorbtive/Serostim (somatropin); Zymfentra (infliximab); Zynlonta (locastuximab tesirine-lpyl); or Zynyz (retifanlimab-dlwr).

* * * * *